US 6,906,506 B1

(12) United States Patent
Reano et al.

(10) Patent No.: US 6,906,506 B1
(45) Date of Patent: Jun. 14, 2005

(54) METHOD AND APPARATUS FOR SIMULTANEOUS MEASUREMENT OF ELECTRIC FIELD AND TEMPERATURE USING AN ELECTROOPTIC SEMICONDUCTOR PROBE

(75) Inventors: Ronald M. Reano, Ann Arbor, MI (US); John F. Whitaker, Dexter, MI (US); Linda P. B. Katehi, Northville, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 23 days.

(21) Appl. No.: 10/092,157

(22) Filed: Mar. 6, 2002

Related U.S. Application Data

(63) Continuation-in-part of application No. 09/877,936, filed on Jun. 8, 2001, now Pat. No. 6,677,769.

(51) Int. Cl.[7] .................. G01R 31/00; G01R 31/308
(52) U.S. Cl. ........................ 324/96; 324/753
(58) Field of Search ............ 324/96, 753; 359/245–247, 359/237, 256–258

(56) References Cited

U.S. PATENT DOCUMENTS

| | | | | |
|---|---|---|---|---|
| 4,002,975 A | * | 1/1977 | Erickson et al. ............. 324/96 |
| 4,269,483 A | * | 5/1981 | Feldtkeller ................ 359/252 |
| 4,563,093 A | * | 1/1986 | Tada et al. ................. 356/368 |
| 4,737,775 A | | 4/1988 | Tokuda et al. .............. 340/647 |
| 4,752,141 A | * | 6/1988 | Sun et al. .................. 374/161 |
| 4,928,058 A | | 5/1990 | Williamson ................. 324/96 |
| 5,111,135 A | | 5/1992 | Kozuka et al. .............. 324/96 |
| 5,247,244 A | * | 9/1993 | Miller et al. ............... 324/96 |
| 5,278,499 A | | 1/1994 | Ito et al. ................ 324/244.1 |
| 5,412,330 A | | 5/1995 | Ravel et al. ............... 324/753 |
| 5,459,394 A | | 10/1995 | De Kort et al. ............. 324/96 |
| 5,592,101 A | | 1/1997 | Takahashi et al. .......... 324/753 |
| 5,713,667 A | | 2/1998 | Alvis et al. ................ 374/178 |
| 5,725,308 A | | 3/1998 | Smith et al. ............... 374/169 |
| 5,772,325 A | | 6/1998 | Hopson et al. ............. 374/753 |
| 5,895,912 A | * | 4/1999 | Bosselmann et al. .. 250/227.17 |
| 5,952,818 A | * | 9/1999 | Zhang et al. ................ 324/96 |
| 6,297,650 B1 | | 10/2001 | Ito et al. .................... 324/753 |

FOREIGN PATENT DOCUMENTS

| | | |
|---|---|---|
| GB | 2343964 | 5/2000 |
| JP | 63-151867 | 6/1988 |
| WO | WO 97/45747 | 12/1997 |
| WO | WO 99/41619 | 8/1999 |

OTHER PUBLICATIONS

William Batty, Andrew J. Panks, Robert G. Johnson, and Christopher M. Snowden, *Fellow, IEEE;* "Electrothermal Modeling and Measurement for Spatial Power Combining at Millimeter Wavelengths"; IEEE Transactions on Microwave Theory and Techniques, vol. 47, No. 12, Dec. 1999.

Hector M. Gutierrez, *Member, IEEE,* Carlos E. Christoffersen, *Student Member, IEEE,* and Michael B. Steer, *Fellow, IEEE,* "An Integrated Environment for the Simulation of Electrical, Thermal and Electromagnetic Interactions in High–Performance Integrated Circuits"; in IEEE 8th Elect. Performance Electron. Packag. Topical Meeting, Oct. 1999, pp. 217–220.

(Continued)

Primary Examiner—Nestor Ramirez
Assistant Examiner—Russell M. Kobert
(74) Attorney, Agent, or Firm—Young & Basile, P.C.

(57) ABSTRACT

An apparatus and method to simultaneously measure electric and thermal fields with a single probe. Using an electrooptic semiconductor probe, the Pockels effect is employed to measure electric field magnitude and phase, and the effect of photon absorption due to bandtail states in the semiconductor is used to measure temperature. Techniques to scale relative electric-field measurements to absolute units (volts/meter), stabilize electric-field phase drift, and calibrate electric-field data that is corrupted when the probe is used in regions where temperature gradients exist are provided.

30 Claims, 17 Drawing Sheets

OTHER PUBLICATIONS

R.G. Johnson, C.M. Snowden, and R.D. Pollard, "A Physics–Based Electro–Thermal Model for Microwave and Millimeter Wave HEMTs," *IEEE MTT–S Int. Microwave Symp. Dig.*, vol. 3, Jun. 1997, pp. 1485–1488.

N.S. Cheng, P. Jia, D.B. Rensch, and R.A. York, "A 120–W X–band Spatially Combined Solid–State Amplifier," *IEEE Trans. Microwave Theory Tech.*, vol. 47, pp. 2557–2561, Dec. 1999.

J. Hubert, L. Mirth, S. Ortiz, and A. Mortazawi, "A 4–watt Ka–band Quasi–Optical Amplifier," *IEEE MTT–S Int. Microwave Symp. Dig.*, vol. 2, Jun. 1999, pp. 551–554.

Y.P. Varshni, "Temperature Dependence of the Energy Gap in Semiconductors," *Physica*, vol. 34, pp. 149–154, May 1967.

H.D. Casey, D.D. Sell, and K.W. Wecht, "Concentration Dependence of the Absorption Coefficient for n– and p–type GaAs Between 1.3 and 1.6 eV," *J. Appl. Phys.*, vol. 46, pp. 250–257, Jan. 1975.

M. Shinagawa and T. Nagatsuma, "Electro–optic Sampling Using an External GaAs Probe Tip," *Electron. Lett.*, vol. 26, pp. 1341–1343, Aug. 1990.

D. Conn, X.Wu, J. Song, and K. Nickerson, "A Full Wave Simulation of Disturbances in Picosecond Signals by Electro–optic Probing," *IEEE MTT–S Int. Microwave Symp. Dig.* New York, Jun. 1992, pp. 665–668.

X. Wu, D. Conn, J. Song, and K. Nickerson, "Invasiveness of $LiTaO_3$ and GaAs Probes in External E–O Sampling," *J. Lightwave Technol.*, vol. 11, pp. 448–454, Mar. 1993.

M.Y. Frankel, J.F. Whitaker, G.A. Mourou, and A. Valdmanis, "Experimental Characterization of External Electrooptic Probes," *IEEE Microwave Guided Wave Lett.*, vol. 1, pp. 60–62, Mar. 1991.

G. Liang, Y. Liu, and K. Mei, "Full–Wave Analsis of Coplanar Wave–Guide and Slotine Using the Time–Domain Finite–Difference Method," *IEEE Trans. Microwave Theory Tech.*, vol. 37, pp. 1949–1957, Dec. 1989.

Yang, K. et al., "High–Resolution Electro–Optic Mapping of Near–Field Distributions in Integrated Microwave Circuits"; *IEEE MTT–S Digest* (1998) p. 949–952. (month unavailable).

David, G. et al., "Electro–Optic Mapping of Guided and Radiated Electric Fields from Microwave Integrated Circuits and Antennas"; CLEO '98, Post–Deadline Paper (May 1998) p. 1,2.

David, G. et al.; "3D Near–Field Analysis of a 4×4 Grid Oscillator Using an Electro–Optic Field Imaging System"; 28th European Microwave Conference (Oct. 5–9, 1998) p. 1–6.

David, G. et al.; "Electro–Optic Imaging of Millimeter–Wave Field Distributions"; Lasers and Electro–Optics Society Annual Meeting (LEOS '98) (Dec. 1998) p. 1,2.

Yang, K. et al.; "Electro–Optic Field Mapping of Quasi–Optic Power–Combining Arrays"; 1999 Ultrafast Electronics and Optoelectronics Conference (Apr. 1999) p. 1–4.

Yang, K. et al., "Far–Field Analysis of a Ka–Band Patch Antenna Array Using High–Resolution Electro–Optic Near Field Mapping"; 2000 European Microwave Conference (2000) p. 1–3, (month unavailable).

Yang, K. et al.; "Microwave–Field Imaging with a Fiber–Based Electro–Optic Probe"; LEOS 2000 (Nov. 2000) p. 1–3.

Yang, K. et al.; "Fiber–Based Electro–Optic Field Imaging System"; 2001 Ultrafast Electronics and Optoelectronics Conference (2001) p. 1–3 (month unavailable).

Yang, K. et al., "Electrooptic Mapping of Near–Field Distributions in Integrated Microwave Circuits"; *IEEE Transactions on Microwave Theory and Techniques;* vol. 46, No. 12 (Dec. 1998) p. 2338–2343.

Yang, K. et al.; "Electrooptic mapping and Finite–Element Modeling of the Near–Field Pattern of a Microstrip Patch Antenna"; *IEEE Transactions on Microwave Theory and Techniques;* vol. 48, No. 2 (Feb. 2000) p. 288–294.

Yang, K. et al.; "Electro–optic field mapping system utilizing external gallium arsenide probes"; *Applied Physics Letters;* vol. 77, No. 4 (Jul. 2000) p. 486–488.

Yang, K. et al.; "Electric Field Mapping System Using an Optical–Fiber–Based Electrooptic Probe"; *IEEE Microwave and Wireless Components Letters;* vol. 11, No. 4, (Apr. 2001) p. 164–166.

Yang, K. et al.; "Active–Amplifier–Array Diagnostics Using High–Resolution Electrooptic Field Mapping"; *IEEE Transactions on Microwave Theory and Techniques;* vol. 11, No. 4 (May 2001) p. 849–857.

Valdmanis, J. et al.; "Subpicosecond Electrooptic Sampling: Principles and Applications"; *IEEE Journal of Quantum Electronics;* vol. QE–22, No. 1 (Jan. 1986) p. 69–78.

Heutmaker, M.S. et al.; "Electrooptic Sampling of a Packaged High–Speed GaAs Integrated Circuit," *IEEE Journal of Quantum Electronics;* vol. 24, No. 2 (Feb. 1988) p. 226–233.

Nagatsuma, T. et al.; "Subpicosecond sampling using a noncontact electro–optic probe"; *J. Appl. Phys.;* vol. 66, No. 9 (Nov. 1989) p. 4001–4009.

Hjelme, D. et al.; "Voltage Calibration of the Direct Electrooptic Sampling Techniques"; *IEEE Transactions on Microwave Theory and Techniques;* vol. 40, No. 10 (Oct. 1992) p. 1941–1950.

Song, J. et al.; "An Equivalent Circuit Model of the Optical Probe in Electro–Optical Sampling Systems"; *Microwave and Optical Technology Letters;* vol. 6, No. 8 (June. 1993) p. 493–498.

Thomann, W. et al.; "Optimization of Electrooptic Sampling by Volume–Integral Method"; *IEEE Transactions on Microwave Theory and Techniques;* vol. 41, No. 12 (Dec. 1993) p. 2392–2399.

Pfeifer, T. et al.; "Optoelectronic On–Chip Characterization of Ultrafast Electric Devices: Measurement Techniques and Applications"; *IEEE Journal of Selected Topics in Quantum Electronics;* vol. 2, No. 3 (Sep. 1996) p. 586–604.

Pfeifer, T. et al.; "Three–dimensional experimental analysis of the near–field and far–field radiation of planer millimeter–wave transmitters"; *OSA Trends in Optics and Photonic Sensors (TOPS)*; vol. 13 (date unavailable).

Pfeifer, T. et al., "Electro–Optic Near–Field Mapping of Planar Resonators"; *IEEE Transactions on Antennas and Propagation*; vol. 46, No. 2 (Feb. 1988) p. 284–291.

Mueller, P. et al., "New Calibration Method in Electrooptic Probing Due to Wavelength Control and Fabry–Perot Resonance"; *IEEE Transactions on Microwave Theory and Techniques*; vol. 47, No. 3 (Mar. 1999) 308–314.

Cecelja, F. et al.; "Electrooptic Sensor for Near–Field Measurement"; *IEEE Transactions on Instrumentation and Measurement*; vol. 48, No. 2 (Apr. 1999) p. 650–653.

Wakana, S. et al., "Novel Electromagnetic Field Probe Using Electro/Magneto–Optical Crystals Mounted on Optical Fiber Facets For Microwave Circuit Diagnosis"; *IEEE MITT–S Digest* (2000) p. 1615–1618, (month unavailable).

Wakana, S. et al.; "Fiber–Edge Electrooptic/Magnetooptic Probe for Spectral–Domain Analysis of Electromagnetic Field"; *IEEE Transactions on Microwave Theory and Techniques;* vol. 48, No. 12 p. 2611–2616, (Dec. 2000).

* cited by examiner

CHARACTERIZATION – ELECTRIC FIELD PHASE

Over one hour, measured temporal phase stability is ±3°

- Frequency domain measurements (2 - 40 GHz):
  |S11| < -30 dB with and without probe.

METHOD AND APPARATUS FOR SIMULTANEOUS MEASUREMENT OF ELECTRIC FIELD AND TEMPERATURE USING AN ELECTROOPTIC SEMICONDUCTOR PROBE

CROSS-REFERENCE TO APPLICATION

This application is a continuation-in-part of application Ser. No. 09/877,936, filed Jun. 8, 2001, now U.S. Pat. No. 6,677,769 issued Jan. 13, 2004, and entitled SCANNING ELECTROMAGNETIC FIELD IMAGER WITH OPTICAL-FIBER-BASED ELECTRO-OPTIC FIELD-MAPPING SYSTEM, the contents of which are incorporated herein in its entirety.

STATEMENT REGARDING FEDERALLY SPONSORED RESEARCH OR DEVELOPMENT

The US Government has a paid-up license in this invention and the right in limited circumstances to require the patent owner to license others on reasonable terms as provided for by the terms of primary Grant No. DAAG-55-97-0132 awarded by the Army Research Office to Clemson University which subcontracts to the University of Michigan by the terms of Grant No. 321-2000222.

BACKGROUND

The present invention relates to electro-optic, semiconductor probes for measurement of electric and thermal fields.

The electrothermal behavior of active microwave and millimeter-wave circuits has received growing attention in recent years. The thermal characteristics become especially important in active antenna arrays and quasi-optical power-combining structures where a multitude of biased monolithic microwave integrated circuits (MMICs) are in close proximity. The generation of heat in such configurations mandates a strong consideration of heat dissipation in the overall design.

Several methods have been developed to characterize and diagnose the behavior of such circuits. To examine the electrical behavior, optical techniques such as those that use electrooptic probes for the noncontact field mapping of electric fields have been employed. Separate methods exist for observing thermal effects including the use of thermal cameras, IR microscopes, thermocouples, and thermistors.

A major factor that has until now, not been considered when applying electrooptic field-mapping techniques to the characterization of active microwave circuits is the temperature dependence of the probe itself. The electrooptic coefficients that govern the response of the probe to RF fields are known to vary with temperature. Additionally, in III–V semiconductor-based probes, the temperature dependence of the optical absorption edge is significant. The sensitivity of the absorption edge to temperature has been used, for example, to monitor the temperature in indium-phosphide-based semiconductor substrates where knowledge of the epitaxial growth temperature is critical.

Thus, it would be desirable to provide an integrated electro-thermal probe which is capable of addressing the temperature-dependant effects associated with gallium-arsenide electrooptic probes. It would also be desirable to provide an integrated electro-thermal probe which is capable of simultaneously measuring both electric and thermal fields to allow for the combined electrothermal examination of active microwave and millimeter-wave circuits with a single probe and the ability to calibrate electric field data that is corrupted when the probe is placed in areas where temperature variations are present.

SUMMARY

The present invention is an integrated electo-thermal probe which is capable of mapping electric fields in a single probe with temperature compensation.

In one aspect, the invention is an electro-optic field mapping apparatus for scanning a workpiece means for generating an optical signal;

an electro-optic field-mapping sensor for receiving the generated optical signal and for generating an output optical signal that is influenced by a free-space electric field associated with the workpiece passing through the sensor;

means for sensing a characteristic of the output optical signal containing electric field information; and means for compensating the sensed characteristic of the output optical signal containing electric field information that is corrupted by temperature variations.

In another aspect the present invention is a method for scanning a workpiece with an electro-thermal apparatus comprising the steps of generating an optical signal, receiving an output optical signal with an electro-optic field-mapping sensor that is influenced by a free-space electric field associated with a workpiece passing through the sensor changing a characteristic of the sensor and the output optical signal;

sensing a characteristic of the output optical signal; and compensating the sensed characteristic of the output optical signal that is corrupted by temperature variations.

BRIEF DESCRIPTION OF THE DRAWINGS

The various features, advantages and other uses of the present invention will become more apparent by referring to the following detailed description and drawing in which.

DETAILED DESCRIPTION

Figure 1:
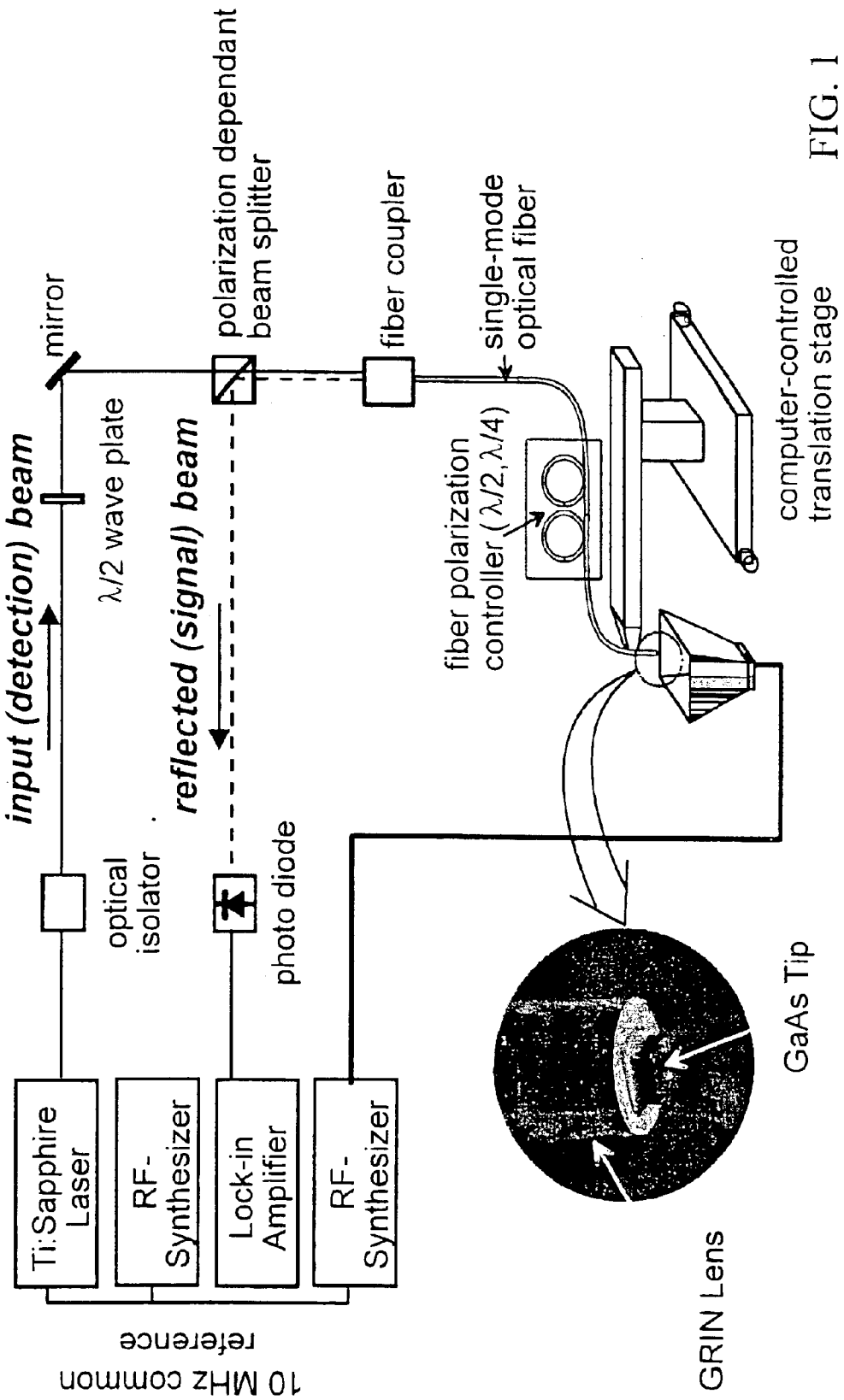
FIG. 1 illustrates an example of a fiber-based electro-optic sampling system shown in schematic view according to the present invention.

FIG. 1 illustrates an example of a fiber-based electro-optic sampling system shown in schematic view. A common reference is provided to a Ti:Sapphire laser, a lock-in amplifier, and two RF-synthesizers. As is conventional, the common reference includes a 40 megahertz (MHZ) reference signal generated by the laser control box, which is multiplied by 2 prior to being sent to the laser, and divided by 4 prior to being sent to two radio frequency (RF) synthesizers. One synthesizer generates another lower-frequency reference signal that is input to the lock-in amplifier. The Ti:Sapphire laser generates an input or detection beam through an optical isolator. The beam passes through a $\lambda/2$ wave plate, sometimes called a "half-wave" plate, and can be redirected by one or more mirrors as required. The initial half-wave plate sets the polarization going into a polarization-dependent beam splitter. The input or detection beam passes through the polarization dependent beam splitter prior to entering a fiber optic coupler. A single-mode optical fiber extends between the fiber optic coupler through a fiber optic polarization controller ($\lambda/2$ or half-wave, $\lambda/4$ or quarter-wave), and attaches to a computer-controlled translation stage, prior to arriving at a gradient index (GRIN) lens attached at the other end of the single-mode optical fiber to focus the beam into the attached GaAs crystal tip. One part of the polarization controller is used to rotate (i.e. acting as a half-wave plate) the linear polarization of the laser relative to the crystal axes of a GaAs probe tip to be described in greater detail below. The beam passes through the GRIN lens and into the GaAs probe tip. The light polarization is modulated by the microwave electric field in the GaAs (the electro-optic effect) as the beam passes through the crystal. The signal beam is reflected off from a high-reflecting (HR) dielectric coating on the open end of the GaAs crystal. The reflected or signal beam passes from the tip back through the GRIN lens, into the optical fiber. The polarization of the laser light is now elliptical, and another part of the polarization controller is used as a quarter-wave plate to convert this beam back into a linear polarization. The reflected beam after passing through the fiber polarization controller of the single-mode optical fiber, then passes through the fiber optic coupler to the polarization dependent beam splitter, where, depending on the angle of the linear polarization, part of the reflected beam is directed to a photo diode in communication with the lock-in amplifier.

Figure 2:
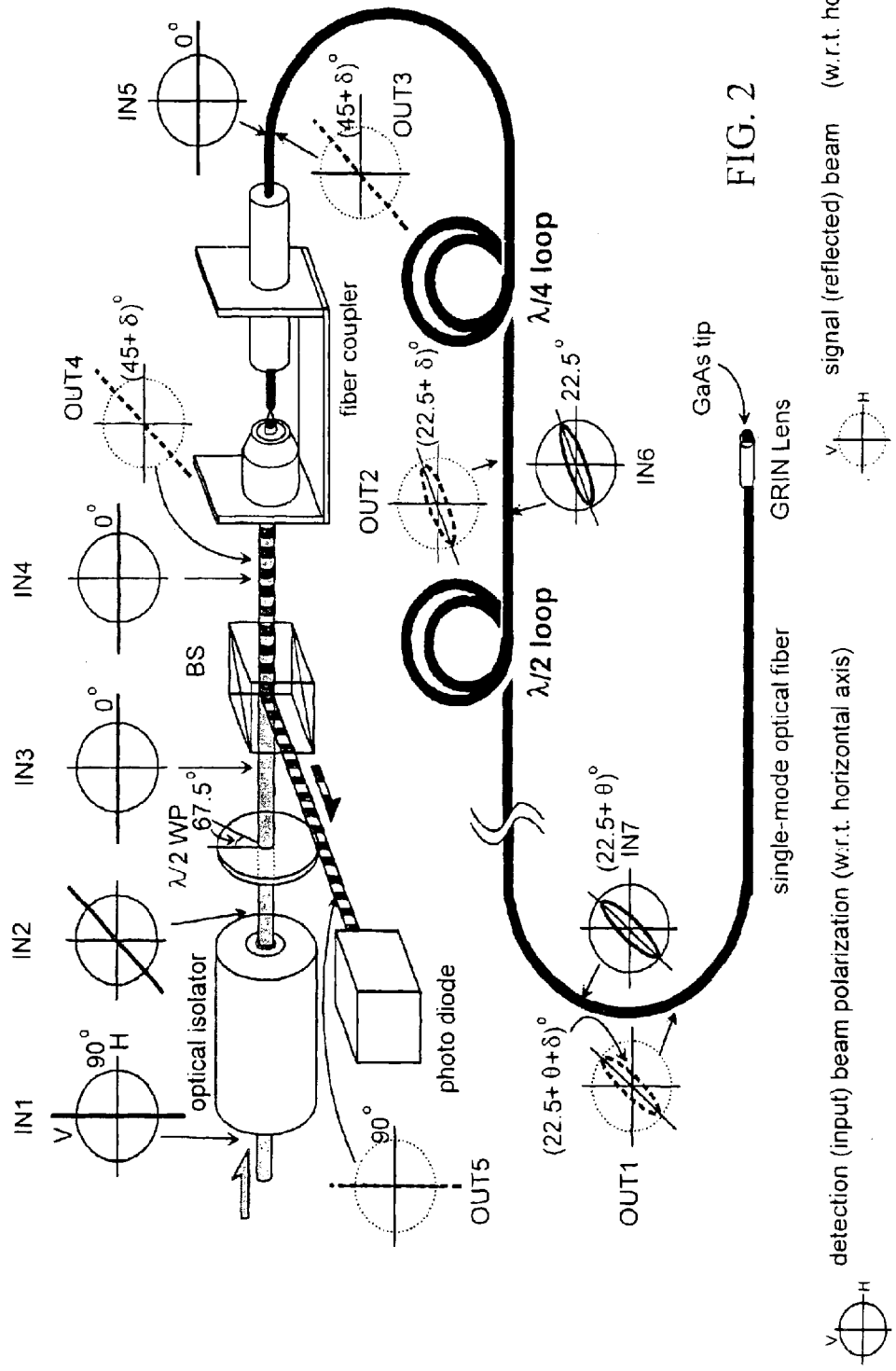
FIG. 2 illustrates the system in greater detail between the optical isolator, λ/2 wave plate, beam splitter, fiber coupler, fiber polarization controller, and termination of the single-mode optical fiber at the gradient index lens and GaAs tip.

FIG. 2 illustrates the system in greater detail between the optical isolator, $\lambda/2$ wave plate, beam splitter, fiber coupler, fiber polarization controller, and termination of the single-mode optical fiber at the gradient index lens and GaAs tip. FIG. 2 shows the beam polarization characteristics as the beam passes through the various components as an input or detection beam, and also as the signal or reflected beam is returned through the single-mode optical fiber, through the beam splitter, to the photo diode.

Figure 3:
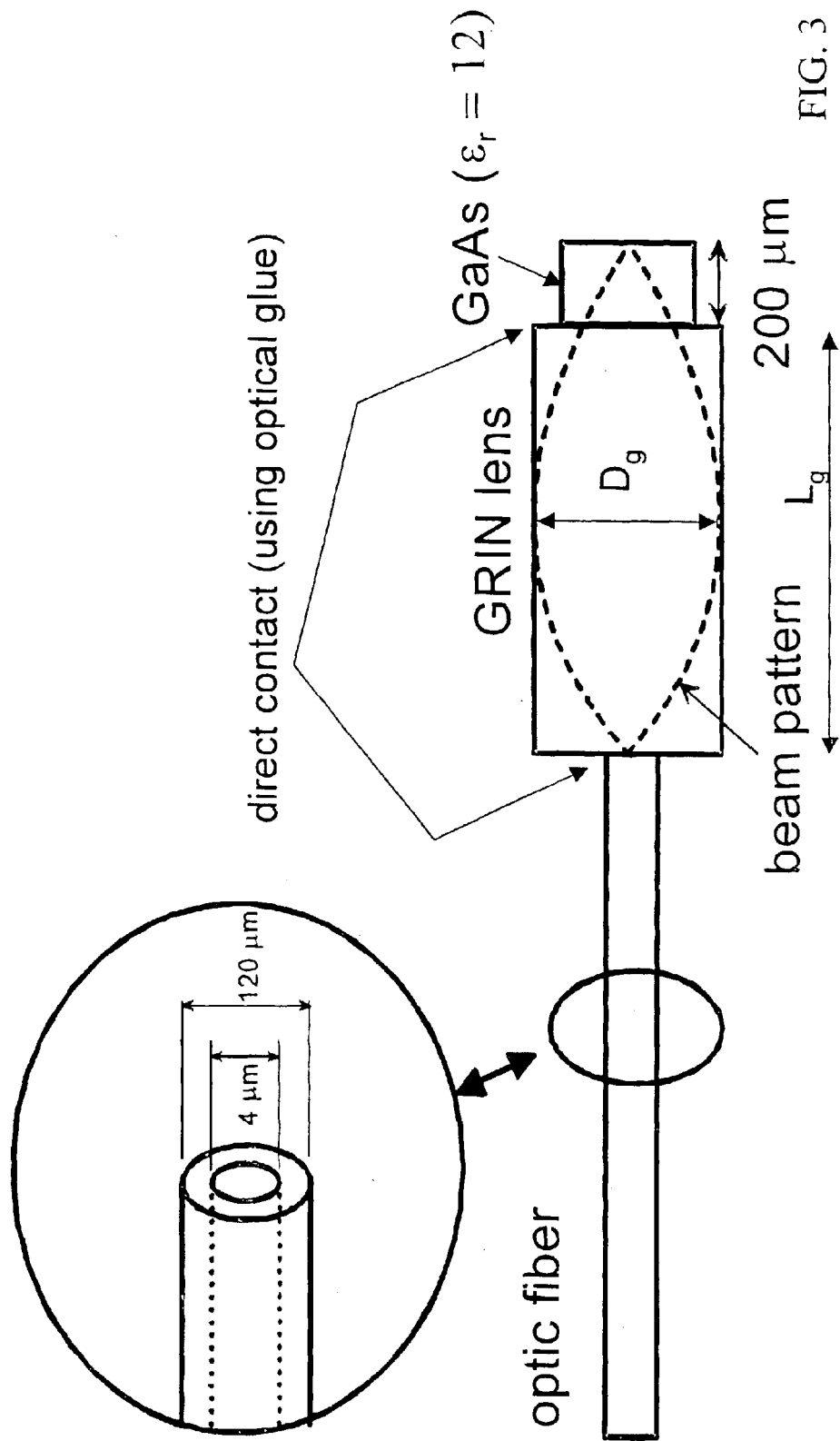
FIG. 3 illustrates the fiber-based electro optic sampling system gradient index lens according to the present invention.
Figure 4:
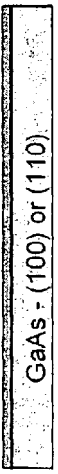
FIGS. 4 through 7 illustrate a probe tip fabrication procedure or method according to the present invention.
Figure 4:
Figure 4:
Figure 4:
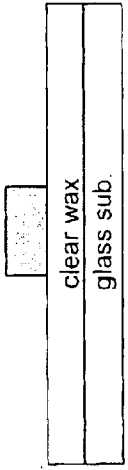
Figure 4:
Figure 4:
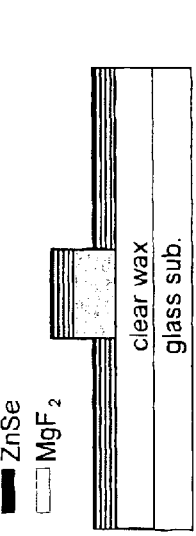
Figure 4:
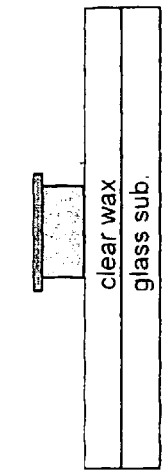

FIG. 3 illustrates the fiber-based electro optic sampling system gradient index lens. The optic fiber by way of example can be approximately 120 micrometers ($\mu$m) in diameter with an interior core dimension of 4 micrometers ($\mu$m). The optic fiber is in direct contact with the gradient index lens using an appropriate optical cement. The length and the diameter of the gradient lens is selected to focus the beam on the face of the probe tip. The probe tip in the illustration of FIG. 3 is shown to be a GaAs crystal ($\epsilon=12$) with a thickness approximately equal to 200 micrometers ($\mu$m) or 350 micrometers ($\mu$m). The laser wave length is greater than or approximately equal to 890 nanometers (nm) in order to avoid absorption of the light in the GaAs.

Referring again to FIG. 1, a schematic diagram of the fiber-based EO sampling system used in this work is illustrated. In general, the optical pulse-train from a phase-stabilized, mode-locked laser (100-fs-duration pulses; 80-MHZ pulse repetition rate) is modulated via the Pockels effect in the GaAs electro-optic crystal by the RF field to be imaged. The laser wavelength is tuned to $\geq 890$ nm and the average input power to the fiber is attenuated to around 15 mW also to avoid absorption by the GaAs. The GaAs electro-optic field imaging according to the present invention provides the probe tip integrated with an optical fiber, vastly improving the positioning ability of the probe and the optical coupling. The polarization-dependent beam-splitter limits the optical transmission to one particular polarization, and this beam is focused into the single-mode optical fiber using a commercial fiber-coupler. A gradient-index (GRIN) lens with diameter of 1.0 mm and length of 5.0 mm is mounted at the opposite end of the fiber to focus the beam onto the surface of the GaAs crystal, which is attached to the GRIN lens using transparent cement. In order to align the linear polarization of the laser to the optic axis of the GaAs and to manipulate the elliptical polarization of the light returning from the probe, two polarization-controlling loops are introduced into the fiber to serve as half- and quarter-wave plates.

The beam reflected from the probe contains the electro-optic signal, modulated by the RF electric field so that it possesses an additional polarization angle, $\delta$. The signal beam is rerouted to the photodiode by the beam splitter, which also converts $\delta$ into an intensity change, and the optical signal is transformed into an electrical signal via the photodiode.

The GaAs tips, with 500×500-micrometer ($\mu$m) footprint area and 200-micrometer ($\mu$m) thickness, have a high-reflection optical coating deposited on the exposed surface.

A <100> orientated GaAs tip was used as the EO crystal to detect the normal electric field component (i.e., relative to the device under test (DUT)), while <110> GaAs was used to sense tangential fields. The orthogonal tangential fields are distinguished by rotating the relative orientation between the <110> GaAs tip and the DUT by 90°.

The sensor end of the fiber is attached to a supporting arm mounted on the computer controlled X-Y translation stage to allow the fiber-mounted probe to be scanned in two directions. All the materials around the sensor area, including the GRIN lens and fiber, have permittivities around 4, except for the GaAs tip itself, which has $\epsilon_r$ of 12, much lower than nearly all conventional EO crystals by more than a factor of 3. Thus the fiber-based system can be expected to reduce any effect of the sensor on the DUT significantly. Furthermore, the measurement flexibility is dramatically improved since the probe may be freely positioned without restrictions arising from the placement of the other optical components or the DUT.

The input RF frequency to the DUT (from the second synthesizer of FIG. 1) is selected to be an integer multiple of the pulse repetition rate of the laser (80 MHZ) plus an additional offset frequency (3.0 MHZ). Using harmonic mixing, the lock-in amplifier receives the 3-MHZ intermediate frequency arising from the difference signal between the synthesizer input and the laser-harmonic local oscillator. A computer records the amplitude and phase of the IF at each measurement point. The 3-MHZ intermediate frequency is the same as the reference frequency of the first synthesizer of FIG. 1.

The probe tip fabrication procedure or method is illustrated in FIGS. 4–7. The fabrication procedure begins with a sample of GaAs having a crystal orientation of 100 or 110. The 100 crystal orientation GaAs sample allows sensing of the "normal" component of the microwave electric field, while the 110 crystal orientation of the GaAs sample allows sensing of the tangential components of the microwave electric field. It is believed that a combination of two or more crystals can be packaged together with two or more optic fibers to measure several field vectors simultaneously. The 100 or 110 crystal orientation GaAs sample has a photoresist (PR 1827) material applied while the sample is rotating at 3,500 revolutions per minute (rpm) for 30 seconds and baked at 105° C. for 1 minute. The sample is then exposed to ultraviolet light for 15 seconds, exposed to a developer (AZ 351) for 50 seconds, and hard baked at 105° C. for 1 minute to create the desired exposed photoresist (PR 1827) pattern. The GaAs sample and photoresist (PR 1827) pattern are mounted on a glass substrate using clear wax on a 150° C. hot plate. The fabrication procedure then continues by wet etching using $H_2SO_4:H_2O_2:H_2O$ in 1:8:1 ratios plus (+) a minute amount (a few drops) of $NH_4OH$. The wet etchant is agitated for 30 seconds, every 30 seconds, and the etchant solution is changed every 10 minutes. The agitation is used and the etchant is changed in order to ensure the uniformity of the etching. Preferably, the agitation is random. This step removes the GaAs material left unprotected by the photoresist (PR 1827) pattern. The sample is then subject to photolithographic processing, where the sample with the photoresist (PR 1827) on top is exposed to ultraviolet (UV) light without the mask for 15 seconds and exposed to the developer (AZ 351) for 90 seconds. The exposure and the developing steps without the mask are executed in order to remove the photoresist (PR 1827) patterns that were originally covering the portions of the GaAs that were to be protected from being etched away. The fabrication procedure then proceeds with a distributed Bragg reflector (DBR) deposition of $MgF_2$=1,403 Angstrom (Å) ZnSe=833 Angstrom (Å) in 4 sets. The final probe tip is released in a hot acetone bath.

Figure 5:
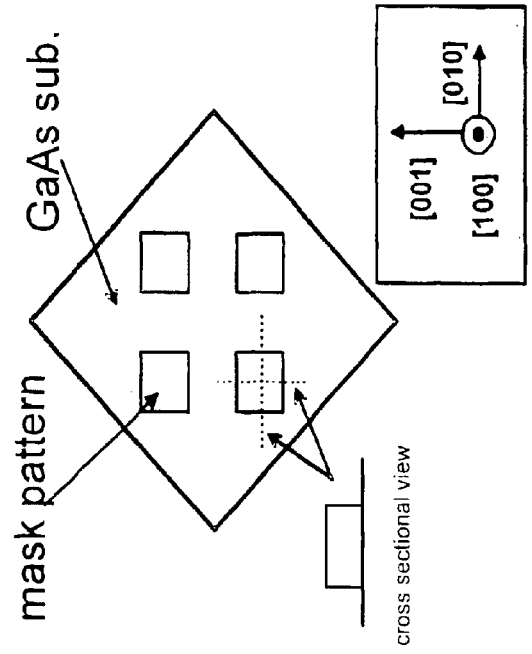
Figure 5:
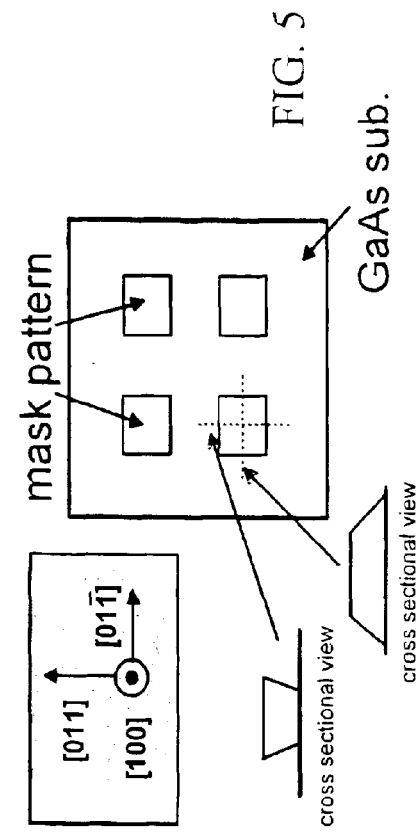
Figure 5:
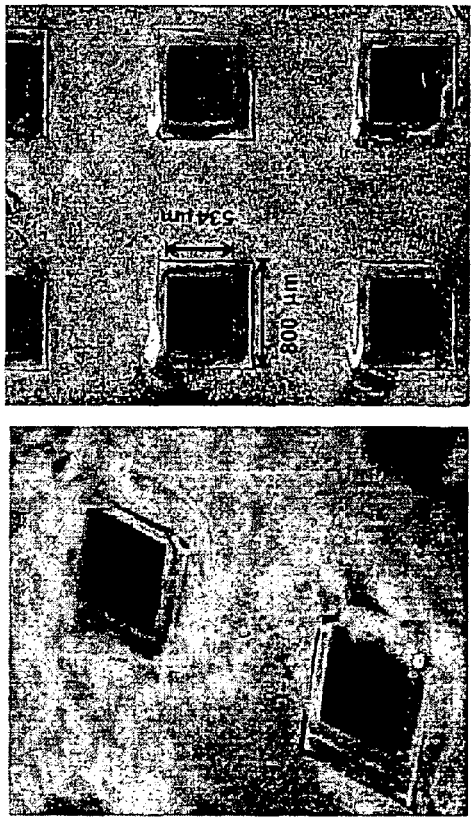
Figure 5:
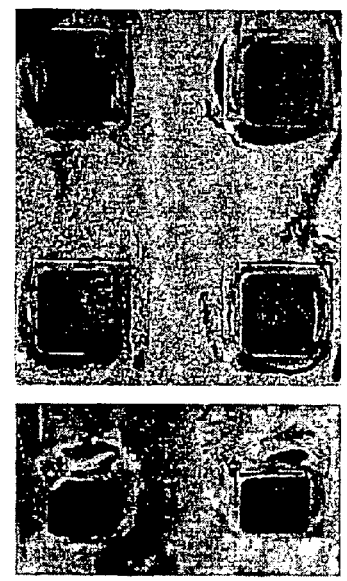
Figure 6:
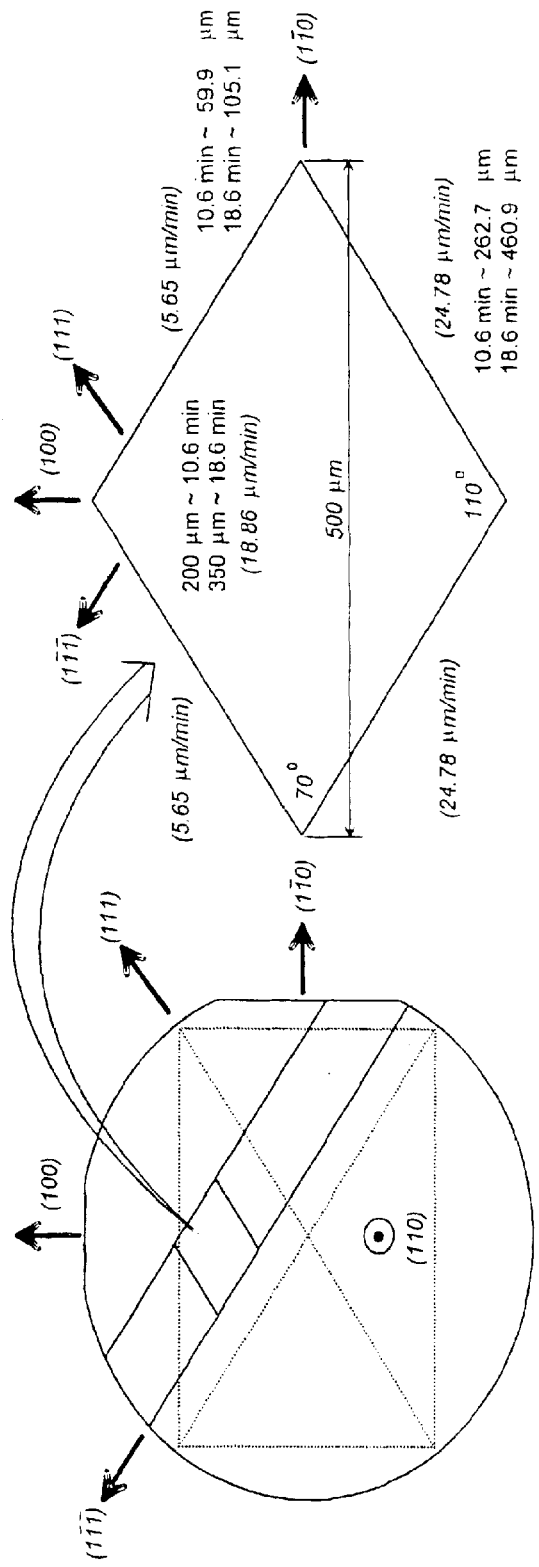
Figure 7:
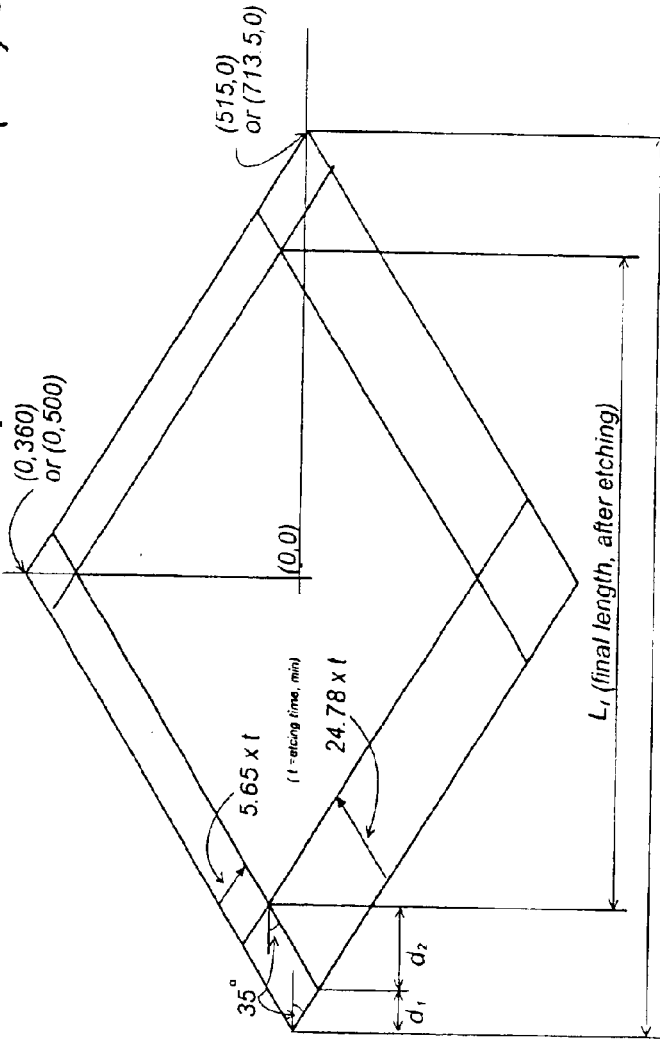
Figure 8:
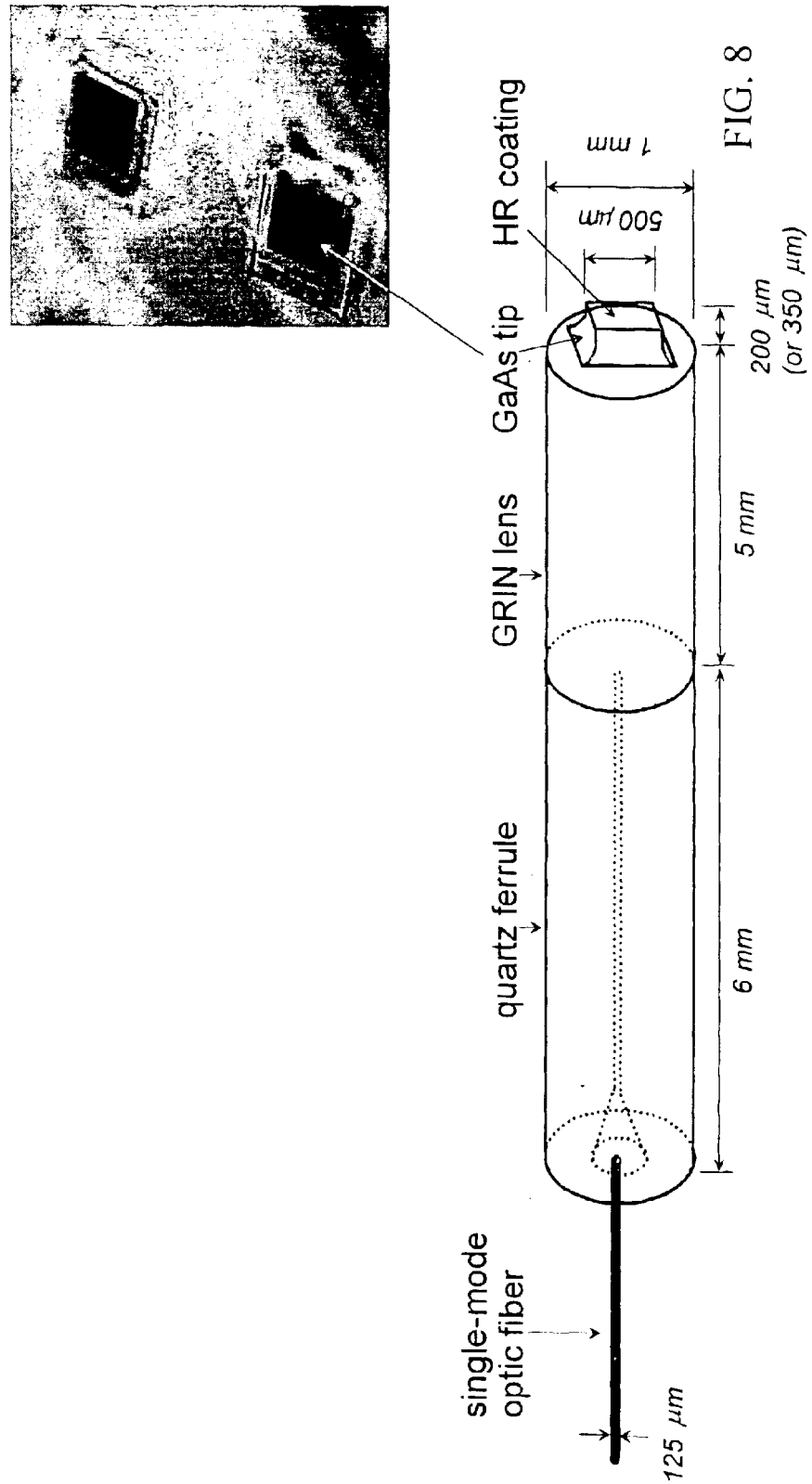
FIG. 8 illustrates a probe head assembly according to the present invention.

As can best be seen in FIG. 5, the photoresist pattern is formed on the GaAs substrate and the material is then subjected to the etching step. The etching depth is approximately 160 micrometers ($\mu$m) obtained at a rate of approximately 7.95 micrometers ($\mu$m) per minute over a 20 minute time period. Lateral etching depth of approximately 130 micrometers ($\mu$m) to approximately 150 micrometers ($\mu$m) occurs at a rate of approximately 6.5 micrometers ($\mu$m) to approximately 7.5 micrometers ($\mu$m) per minute. As best seen in FIGS. 7 and 8, the goal during the fabrication procedure is to obtain a probe tip with a final length after etching of approximately 500 micrometers ($\mu$m). The etching process removes material at varying rates depending on the orientation of the mask requiring calculation of the initial mask size based on the etching time as set forth in the equation shown in FIG. 7.

The probe head assembly is illustrated in FIG. 8. The single-mode optical fiber is inserted into one end of a quartz ferrule of approximately 6 millimeters (mm) in length. A gradient index lens of approximately 5 millimeters (mm) in length is connected at the opposite end of the quartz ferrule. The GaAs tip is connected to the opposite end of the gradient index lens from the quartz ferrule. The GaAs tip is approximately 500 micrometers ($\mu$m) square and has a thickness of approximately 200 micrometers ($\mu$m) or 350 micrometers ($\mu$m). The overall diameter of the quartz ferrule and gradient index lens is approximately 1 millimeter (mm).

It is expected that a wide variety of additional electrical-optic materials can be substituted for GaAs as a sensor in the fiber-based electric-field-imaging system. These can include (a) other semiconductor materials; (b) non-semiconductor solid-state crystals; (c) organic crystals; and (d) polymers. The semiconductors can be chemically etched to the desired shape and dimensions, while it would be necessary to mechanically machine and polish the other crystals. Polymer films can be introduced in a solution from which the solvent is allowed to evaporate either before or after poling of the polymer with a direct current (DC) electric field.

It is believed that suitable electro-optic materials can include (a) aluminum-gallium arsenide (AlGaAs), indium phosphide (InP), cadmium telluride (CdTe), zinc selenide (ZnSe), zinc telluride (ZnTe), bismuth silicate ($Bi_{12}SiO_{20}$), cadmium sulfide (CdS), Cadmium Selenide (CdSe).

It is believed that additional electro-optic materials can be used in the fabrication of an electric-field sensor as these new synthesized materials become available, particularly in the area of polymers having the desired electro-optic properties for the present application.

The above described electric field imaging system is believed to be applicable to a number of different applications, by way of example and not limitation, such as quality control along microwave-circuit production lines, where as a circuit passes by, the probe could be dipped into key internal nodes to probe the functionality of the circuit; trouble-shooting of cross-talk within microwave enclosures, where inserting the probe through a small aperture in a microwave or mixed-circuit package in order to investigate where strong fields build up once the package is sealed; validation of circuit or electromagnetic theoretical and/or computer models, such as for microwave circuits or elements, where measuring fields in locations that are otherwise inaccessible enables the accuracy of computations of these fields to be determined; electromagnetic interference, where investigating the source of strong fields within complex systems would enable designers to avoid interference between components and enable effective shielding; and measurement of microwave electric fields in vivo or at the surface of the skin for biomedical imaging.

EXAMPLE 1

In order to demonstrate the versatility of the fiber-based EO field-mapping system, the normal electric field component inside of a shielded microstrip transmission line, which may not be obtained by any other measurement method, including free-space EO field mapping, was imaged using the <100>-oriented GaAs probe tip. This field pattern was then compared with the field distribution from an identical microstrip without a shielding cavity. For the measurement, a 50-Ωmicrostrip transmission line was fabricated on a duroid substrate with 75-mil thickness and a dielectric constant ($\epsilon_r$) of 6.15. The output port of the microstrip was short-terminated in order to provide a standing wave pattern.

Figure 9:
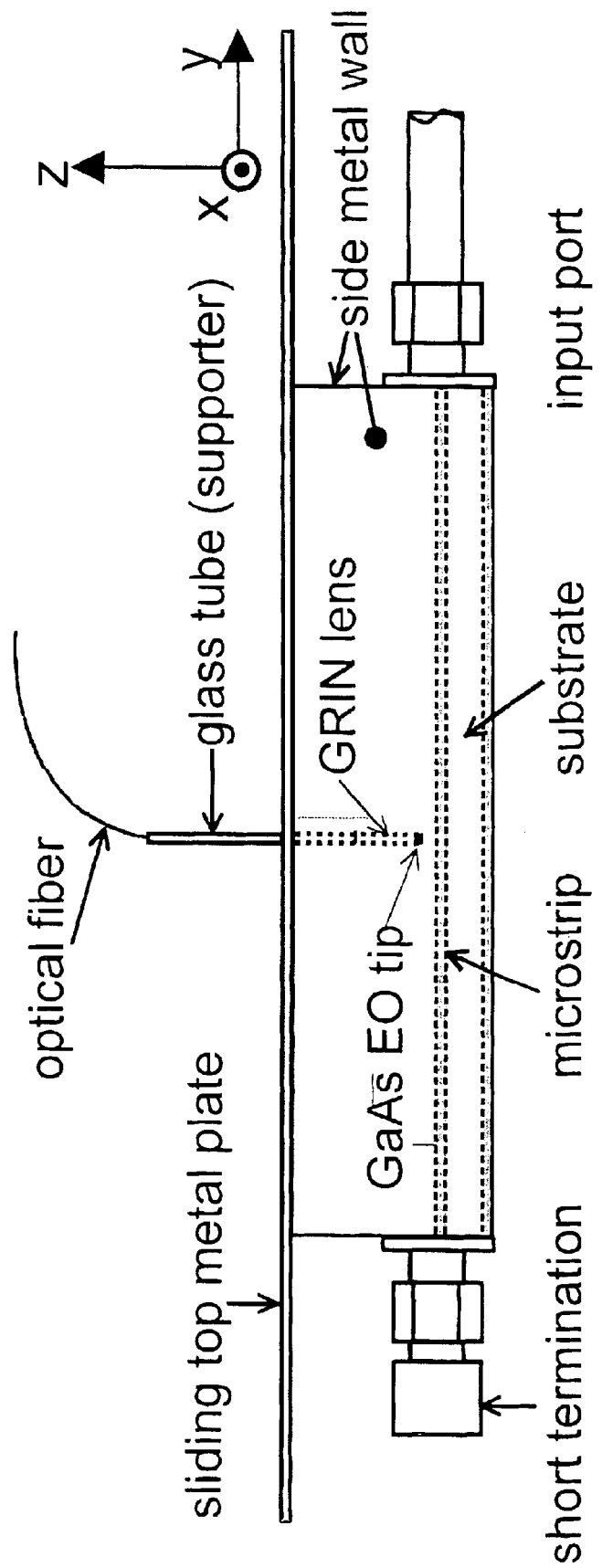
FIG. 9 illustrates a closed metal cavity according to the present invention allowing a probe tip to have freedom of movement in three dimensions within the closed metal cavity using an oversized sliding top metal plate to cover the enclosure.

The height of the cavity wall was 6.0 mm above the top surface of the microstrip. In order for the probe tip to have freedom of movement to three dimensions in the closed metal cavity, an oversized sliding top metal plate was employed to complete the enclosure. A 2-mm diameter access aperture in the sliding top plate allowed the EO probe to be positioned inside of the cavity as shown in FIG. 9. Since the top plate and the fiber-based EO probe were mechanically connected to the x-y translation stage, the probe could scan a two-dimensional field distribution from the interior of the cavity, while the top plate maintained electrical contact to the cavity walls. In addition to the two-dimensional (i.e., x-y plane) field mapping capability, the vertical position (z-direction) of the probe could be adjusted externally.

For both exposed and shielded microstrip, the normal electric fields were measured at distances of 1.0, 2.5, and 5.0 mm from the top of the microstrip surface. The scanning window was 2.9 cm (x) by 3.9 cm (y), using the step sizes (and thus also the spatial resolutions) of 580 micrometer ($\mu$m) (x) and 780 micrometer ($\mu$m) (y). Each field map was acquired in approximately 15 minutes.

The results show typical standing wave patterns that have periodic peaks with 180° phase changes. The separation between the peaks on the microstrip was 0.87 mm, which shows excellent agreement with the theoretically expected peak-to-peak distance. The peak amplitudes were reduced by 16 dB as the measurement distance increased from 1.0 mm to 5.0 mm for the exposed microstrip.

Figure 10:
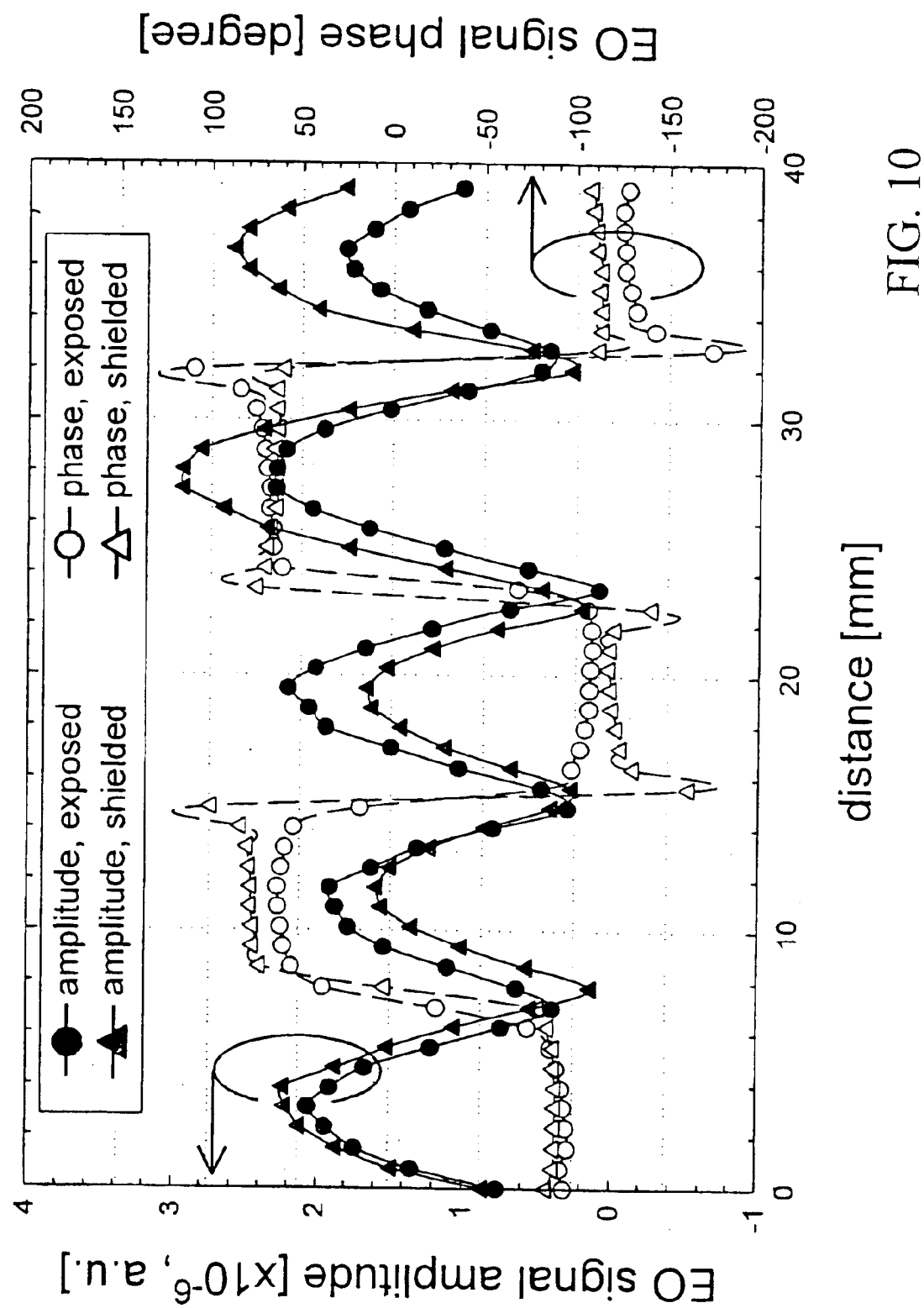
FIG. 10 illustrates only a one-dimensional comparison between an exposed and a shielded microstrip along the corresponding centerlines at a 1.0-mm height according to the present invention.

While two-dimensional field maps were extracted at all three measurement heights, in FIG. 10 only the one-dimensional comparison between the exposed and shielded microstrip along the centerlines at a 1.0-mm height is shown. The phases show virtually identical changes of 180° for each amplitude peak. However, a nonuniform amplitude distribution is observed on the shielded microstrip, while the exposed microstrip exhibits a reasonably uniform amplitude distribution. Since the geometries of the two microstrips (including the size of the substrate) are identical, the most plausible explanation for the amplitude discrepancy is the existence of a cavity-mode wave. The cavity mode wave was thus calculated based on the cavity resonator theory, and the effect of the microstrip substrate was taken into account using the cavity perturbation theory. Superimposing the calculated cavity standing wave pattern on the exposed microstrip result demonstrates that the cavity measurement accurately reveals the effect of the enclosure on the microstrip.

While the two-dimensional field images of relatively simple structures could also be computed using numerical full-wave analysis methods, this striking experimental example shows that the actual field patterns can be extracted from a package for the purposes of fault analysis or to diagnose sources of cross-talk or interference that are not quickly or easily computed.

EXAMPLE 2

In order to demonstrate the application of this fiber-based field-mapping probe to radiating waves, and also to use the transverse-field measurement capability, the dominant electric field component of a Ka-band horn was scanned using a <110> GaAs probe tip both in the aperture plane (plane A) and in a plane that was two wavelengths from the aperture within the interior of the horn (plane B). The scanning areas were 3.39 cm×5.57 cm for plane A and 2.78 cm×4.17 cm for plane B, with plane B being reduced in size due to the natural taper of the microwave horn antenna. Fifty scanning steps were used for both the x- and y-directions, with a single scan taking approximately 30 minutes.

The results indicate, as expected, that there is a more uniform field distribution for both amplitude and phase at the aperture, while the wave front is quite curved inside of the horn cavity. Specifically, the phase of the field at the aperture has an almost uniform distribution, while it displays about a 50° phase variation across the scanned area along the y-axis on the plane B.

The above described electric field imaging apparatus and sensor can be uniquely employed to also measure and/or compensate for temperature.

Theory

The physical mechanisms employed to measure temperature are the temperature dependence of the energy bandgap in intrinsic semiconductors and its effect on the absorption of optical power. The following is a well-known equation describing this phenomena, as established by Varshni:

$$E_g(T) = E_g(0) - \frac{\gamma T^2}{T + \beta} \quad (1)$$

where $\gamma$ and $\beta$ are material-specific empirical constants, $E_g$(T) is the bandgap energy at temperature T, and $E_g$(0) is the bandgap energy at 0 K. For photon energies in the bandgap and near the band edge, the absorption coefficent a has been found to decay exponentially with decreasing photon energy hv due to the presence of bandtail states. The dependence on photon energy is shown to follow:

$$\alpha = A \exp[(hv - \chi_o)/y_o] \quad (2)$$

where A, $\chi_o$, and $y_o$ are constant curve-fitting parameters at 300 K. For GaAs at room temperature ±70K, the bandgap and absorption coefficient variation with temperature can be linearized to within 5%. Linearizing (1) and (2) about a nominal temperature $T_o$ and photon energy $(hv)_o$ and noting that $$\frac{\partial \alpha}{\partial (hv)} = \xi \frac{\partial \alpha}{\partial E_g} \quad (3)$$

where $\xi$ is a constant on the order of one for the temperature range of interest, the flow of optical power P through the semi-conductor is found to obey the following temperature dependence:

$$\frac{1}{P} \alpha 1 + \kappa T \quad (4)$$

where $\kappa$ is a constant that depends on the dimension of the semi-conductor in the direction of propagation. Therefore, by monitoring the absorption response of an optical beam that is directed to propagate through a section of semiconducting material, the change in temperature can be inferred in a manner that is linear with the inverse of optical power.

To simultaneously measure electric fields, the semiconductor must also be electrooptic. Due to the Pockets effect, an optical beam propagating through an electrooptic material exhibits a change in polarization state when the material is in the presence of an externally applied, and relatively low-frequency electric field. The change in polarization state can be made to result in an amplitude modulation of the optical beam that is proportional to the intensity of the applied electric field. The optical transmission $T_o$ through an electrooptic modulator set up for 50% transmission is given by:

$$T_0 = \sin^2\left[\frac{1}{2}\left(\frac{\pi}{2} + \pi\frac{E_{rf}d}{V_\pi}\sin(\omega_{rf}t + \phi_{rf})\right)\right] \quad (5)$$

where $E_{rf}$ is the average RF electric-field magnitude induced in the probe, $\phi_{rf}$ is the RF electric-field phase, d is the crystal thickness along the direction of propagation of the optical beam, $\omega_{rf}$ is the RF frequency, t is time, and $V_\pi$, is the half-wave voltage of the electrooptic material. For $E_{rf}d \ll V\pi$, the intensity modulation is linear with the average RF electric field induced across the probe.

Implementation

Figure 11:
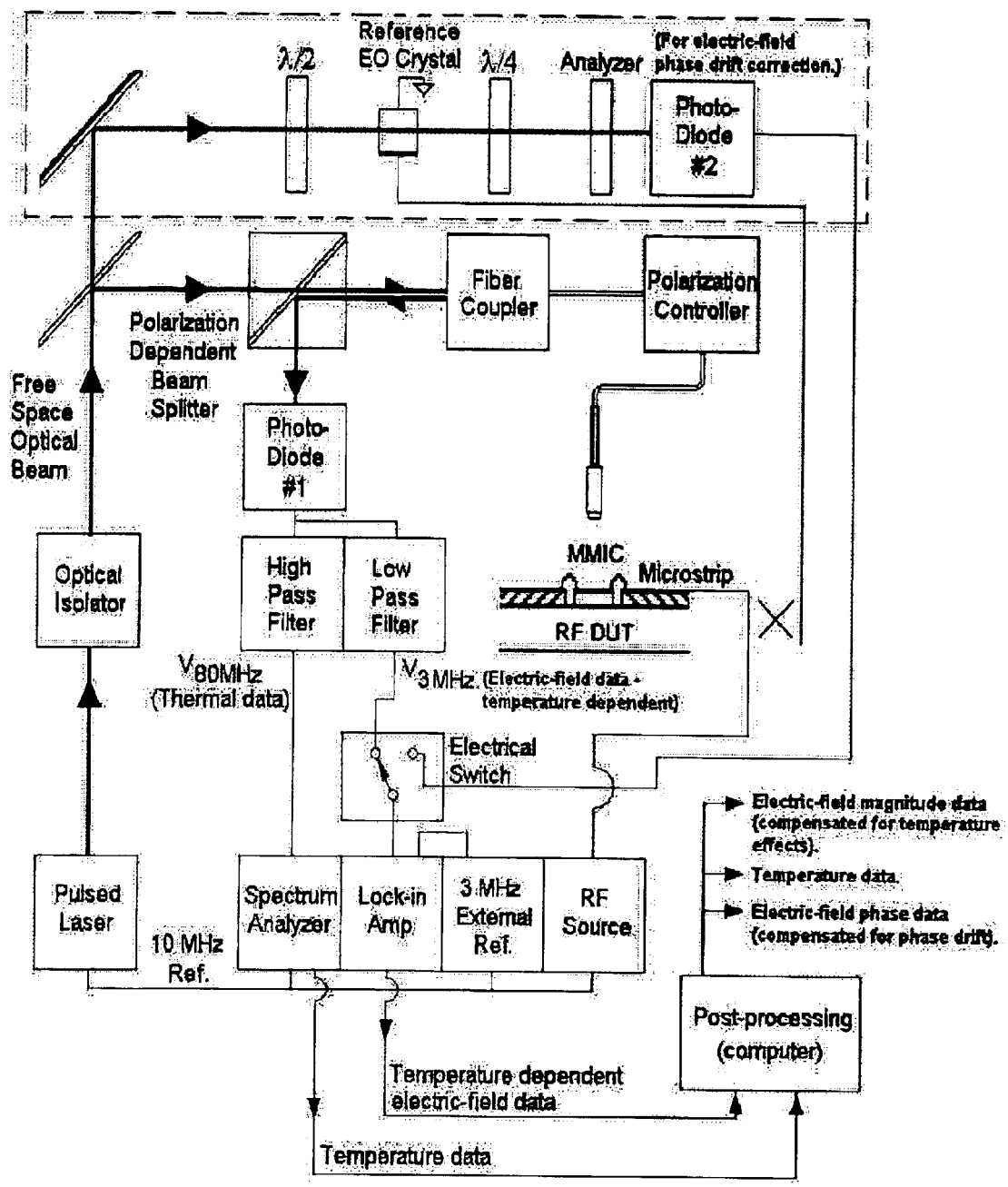
FIG. 11 is a block diagram of an integrated electro-thermal probe and measurement apparatus according to the present invention.
Figure 12:
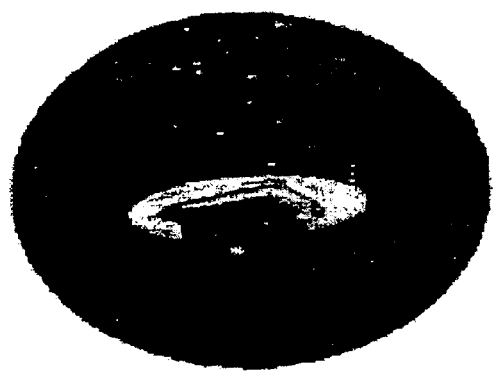
FIG. 12 is an enlarged, pictorial representation of the probe shown in FIG. 11.
Figure 13:
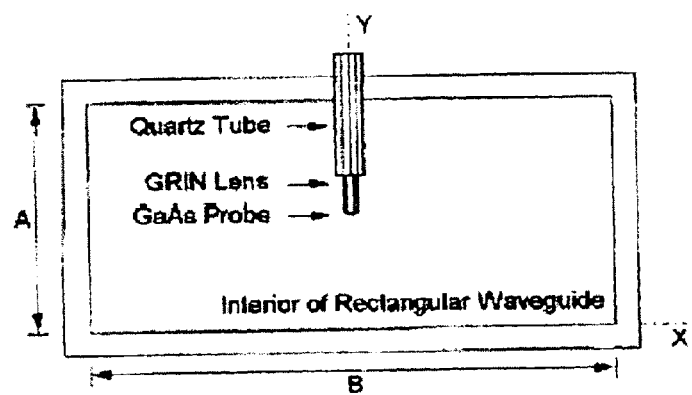
FIG. 13 is a cross-sectional view of the probe shown in FIG. 12.

The apparatus is shown in FIG. 11. The probe material is <100> oriented GaAs with a normal-surface area of 500 $\mu$m×500 $\mu$m and a vertical thickness of 200 $\mu$m. A Ti: sapphire laser tuned to 895 nm is used to generate a linearly polarized sampling beam that is coupled to the probe via a section of single-mode optical fiber and a graded-index lens. Appropriate phase retarders are placed to configure a 50% transmission intensity modulator for electric-field measurements.

To alleviate the need for a fast photodetector, and to provide a method by which the phase of a signal may also be easily sensed, the device under test is fed via an RF synthesizer configured for harmonic mixing in order to down convert the sampled electric fields to IF frequencies. This is accomplished by mode locking the laser to produce a train of 80-fs pulses at a pulse repetition rate of 80 MHz and setting the RF source frequency to an integer multiple of the pulse repetition rate, plus an offset that corresponds to the IF frequency. An IF frequency of 3 MHz is used and was selected based on a tradeoff consideration between signal-to-noise degradation due to 1/f noise at lower IF frequencies and the loss of sensitivity incurred by selecting higher IF frequencies. Since the 80-MHz component is not modulated coherently, its amplitude does not change as it passes through the electrooptic crystal.

A photodiode functions as an envelope detector that transforms the 3-MHz modulation and the 80-MHz pulse-repetition component to electrical signals for detection. The 3-MHz signal, denoted $V_{3\,MHZ}$, is the modulation signal that provides the electric-field information and the 80-MHz signal, denoted $V_{80\,MHZ}$, is the spectral component that is monitored for temperature measurements. A high-pass filter that filters as an open-circuit couples the 80-MHz pulse-repetition component to a spectrum analyzer while the 3-MHz modulation signal is coupled to a lock-in amplifier with a low-pass filter that filters as an open-circuit for the 890-MHz signal. Such an arrangement allows for the simultaneous measurement of thermal and electric fields.

Thermal Response

To characterize the thermal properties of the electrooptic sensor, the probe was mounted in still air approximately 4 in above a hotplate. A precision thermistor with a tolerance of ±0.2° C. was positioned adjacent to the probe to monitor the temperature variations of the ambient air as the hot plate was turned on and off. Absorption data from the probe and temperature data from the thermistor were collected over a 50-min period as the temperature was varied between 20° C.–60° C. The results agree with the theory as described in (4).

The temperature accuracy and sensitivity of the probe are determined from a linear regression analysis of the data. The accuracy, calculated from the standard deviation of the data set composed of the absolute value of the deviations from the linear fit, is calculated to be ±0.5° C. Using the thermistor resistance versus temperature characteristic and the observed relationship between the measured optical power and thermistor resistance, the sensitivity is calculated to be equal to 0.31 $\mu$W/° C. at 25° C.

Absolute Electric-Field Magnitude

The output of the lock-in amplifier is a dc voltage that is proportional to the first harmonic rms amplitude of the RF modulation signal. Although this scheme is useful for relative electric-field measurements, scaling the output to electric field units (i.e., volts/meter) is desirable in order to obtain absolute average field measurements and to characterize the dynamic range of the system. A direct determination of the proportionality constant relating the output of the lock-in amplifier and $E_{rf}d$ would allow the output to be scaled to absolute units. However, this would require an accurate characterization of the power mismatches presented by the fiber coupler, the interface between the fiber and the grin lens, the interface between the grin lens and the GaAs probe, and the reflectivity of the Bragg reflector.

To circumvent these practical difficulties, an alternative method for scaling the measured data to absolute units has been developed. This method involves placing the probe in a region where the absolute value of the electric-field distribution is known. The region inside of a shorted rectangular waveguide enclosure was selected due to the simplicity of the analytical closed-form field solutions, the confinement of the fields within a closed structure, and the direct relationship between the power input into the waveguide and the absolute magnitude of the electric field. Previous investigators have scaled electrooptic signals to RF electromagnetic fields associated with open structures such as microstrip and coplanar waveguide lines in order to determine minimum detectable signal levels. The method presented here, however, involves a completely enclosed structure. Relating input RF power to expected fields over an open structure such as microstrip or coplanar waveguide (CPW) leads to inaccuracies due to losses associated with radiation, losses associated with the coax-to-microstrip/CPW transitions, the sensitivity in the positioning of the probe above the line (due to exponentially decaying fields), and the need to rely on nonclosed-form solutions of the microstrip/CPW fields. The approach presented in this paper is also independent of the height of the crystal above a device-under-test (DUT) since the procedure directly scales the amplitude measurement on the RF lock-in with the induced optical retardation.

The geometry of the insertion of the probe into the rectangular waveguide is shown in FIG. 3. In the absence of the probe, the magnitude of the electric field at a standing wave peak $|E_{peak}|$ can be related to the input power P via the wave equation and the Poynting vector as $$|E_{peak}| = \sqrt{\frac{16P\omega\mu_0}{k_zAB}} \quad k_z = \sqrt{\omega^2\mu_o\varepsilon_o - \frac{\pi}{B}} \quad (6)$$

where $\omega$ is the radian frequency, $\mu o$ is the free-space permeability, $\epsilon$ is the free-space permittivity, $k_z$ is the phase constant along the direction of propagation, A is the length of the short edge of the rectangular waveguide, and B is the length of the long edge. Since each quantity on the right-hand side of the equation for $|E_{peak}=$ is measurable, the expected value for the magnitude of the electric field at a standing-wave peak can be determined.

A complication is the distortion of the electric field due to the presence of the probe in the waveguide. Since the graded-index lens self-focuses the optical beam to a beam waist of less than 10 μm, the field internal to the probe within a 10-μm-diameter cylinder centered between the top and bottom faces of the probe is the region of interest. For frequencies such that the guide wavelength is much larger than the probe dimensions, a quasi-static approximation bounds the electric field inside the probe $E_{int}$ to $$\frac{1}{\varepsilon_{rp}} E_{ext} < E_{int} < E_{ext} \quad (7)$$

where $E_{ext}$ is the field in the absence of the probe and $\varepsilon_{rp}$ is the dielectric constant of the probe. The relation in (7) holds because the probe appears as a dielectric object that is neither a thin slab, nor a long thin cylinder. A full-wave finite-element-method-based simulation based on the geometry in FIG. 1 was employed to analyze the expected ratio of $E_{int}$ to $E_{ext}$. The average electric-field induced in the probe is found to be 19% of the electric field when the probe is absent. This factor is taken into account when scaling relative measurements to volts/meter via (6).

For this experiment, a shorted WR-137 waveguide (height A=15.8 mm, width B=34.9 mm) was employed and the operating frequency was set to 6.963 Ghz. The waveguide short was coupled to the RF synthesizer via a coaxial cable and coax-to-waveguide adapter. An RF power meter was used to measure the input power going into the waveguide from the coax-to-waveguide adapter. The mismatch at the coax-to-waveguide transition was characterized via time-domain (bandpass) measurements on a vector network analyzer. The peak return loss at the coax-to-waveguide transition was −29 dB below the peak return loss at the waveguide short. Therefore, the transition mismatch can be neglected with negligible error. The lock-in voltage can be scaled to average volts/meter in a linear fashion. By stepping down the input power, the minimum detectable average electric field inside of the probe is 1.24 V/m. A measurement error of ±0.06 V/m is estimated from consideration of the measurement error of the power meter, positioning error of the probe within the waveguide, convergence error associated with the ratio of $E_{int}$ to $E_{ext}$, and the error in the linear fit of the data extrapolated to the noise floor.

To state a sensitivity for the system, knowledge of the system bandwidth is required. Since a lock-in amplifier is employed in the last stage, the system bandwidth is determined by the time constant on the output RC circuit. For these measurements the time constant was 300 ms. Therefore, the sensitivity of the system is 0.68±0.03 V/m/√Hz. This value is useful as a figure-of-merit, but should be interpreted with caution. In particular, it is dependent on the intensity of the input optical beam imposed on the electrooptic crystal. The maximum input power of the optical beam that can be coupled into the fiber is limited to 20 mW in order to avoid two-photon absorption in the GaAs. The actual optical power that reaches the probe tip is dependent on the system optical alignment, which is dominated by the coupling of the free-space beam into the optical fiber via the fiber coupler. To date, 0.68 v/m/√$H_z$ is the highest sensitivity that this system has demonstrated.

Temporal Stabilization of Electric-Field Phase

An external 40-MHZ crystal oscillator serves as the master phase synchronization signal for the entire system. This oscillator is frequency multiplied to 80 MHz to provide external feedback to the Ti: sapphire-laser pulse repetition rate and frequency divided by ten in order to provide a common 10-MHZ reference signal for the external 3-MHZ lock-in reference and the RF synthesizer. In principle, modulation on the 80-MHZ pulse train will be phase synchronized with the 3-MHZ reference oscillator allowing phase measurements of the electric field. Observations of the measured phase stability over time, however, have produced results that demonstrate a consistent phase drift in the system.

In order to correct for the phase drift, a reference electrooptic signal has been integrated into the system. A key point regarding this method of phase stabilization is that it corrects for phase drift regardless of the source of phase instability (whether it be due to a single component of the system or due to a combination of components). As shown in FIG. 11, a beam splitter is used to couple 30% of the free space optical beam to a beam-line consisting of a half-wave plate, an electrooptic probe crystal, a quarter-wave plate, a polarizer, and a second photodiode. The optical elements are configured to produce 50% transmission intensity modulation of the optical beam in response to an RF modulating signal, which is coupled off from the RF source feeding the DUT. An electrical switch is employed to toggle between the photodiode that collects data from the DUT and the photodiode that collects data from the reference crystal.

By using the phase reference channel, the system phase drift can be calibrated out. The reference electrooptic crystal was bismuth silicate (BSO), although any electrooptic crystal with a sufficient $n^3r$ parameter will suffice, and the modulating signal was imposed on the crystal via a horn antenna (8.003 Ghz RF) for simplicity. The probe was kept stationary above the DUT while phase data was toggled between photodiode #1 and photodiode#2 every 10 s. Over a 60-min time interval, the uncalibrated phase data from photodiode #1 happened to drift from 49° to −8°. This data represents an intermittent system temporal phase instability. The phase data from the reference channel is seen to drift along with the data from the DUT. Subtracting the phase drift in the uncalibrated data results in the calibrated data set, which shows a standard deviation of +3° over the 60-min time interval.

Invasiveness

A. Simulations

The DUT that is selected for the study of probe Invasiveness is a CPW transmission line. The choice of the CPW line as the DUT allows the Invasiveness of the probe to be quantified in terms of the characteristic impedance of the line and the capacitance per unit length. When the probe is placed in close proximity to the DUT, two undesirable effects occur. First the DUT is electromagnetically perturbed and, second, the sampled electric field present in the probe is distorted. The first effect is examined in this paper. The second effect has been examined in the time domain where electric fields generated on a CPW line due to the propagation of sub-picosecond pulses have been analyzed. It was found that, due to strong dispersion above 0.6 THz, the sampled signal field in the probe can be significantly different from the unprobed field. In the spectral domain, however, where the fields are mapped spatially at a single frequency, measurements of the sampled field inside of the probe have demonstrated spatially at a single frequency, measurements of the sampled field inside of the probe have demonstrated spatial measurements that are in good agreement with both analytical and simulated field solutions.

The Invasiveness of dielectric probes over transmission lines, in terms of $S_{11}$, was studied via finite-difference-timedomain simulations in by a two-dimensional (2-D) quasi-static field analysis based on a TEM-mode assumption and experimentally in terms of time-delayed pulses. Invasiveness is quantified in terms of the spacial perturbation in the characteristic impedance and capacitance per unit length of a CPW line with the probe present via a quasi-static field analysis based on field solutions from three-dimensional full-wave finite-element-method simulations. This method is applied at 10 GHz and is applicable at low microwave frequencies where the imaginary part of the characteristic impedance is relatively small. At higher frequencies, the imaginary part of the characteristic impedance becomes appreciable due to space and surface wave radiation. Supporting measurements in the time and frequency domains follow the simulations.

Figure 14:
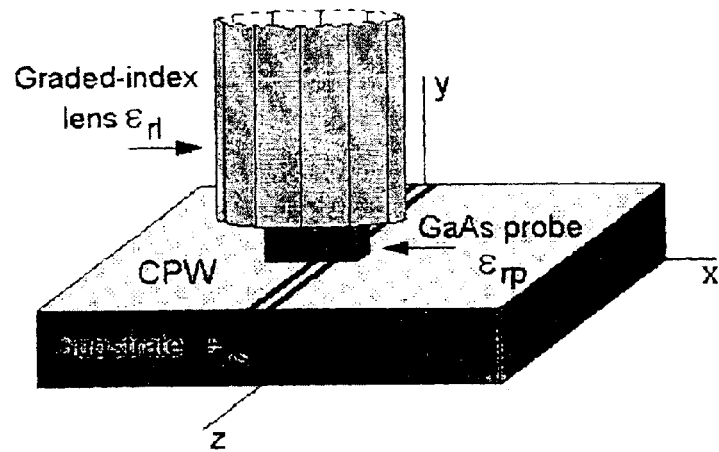
FIG. 14 is a graph depicting measured phase drift and correction.
Figure 15:
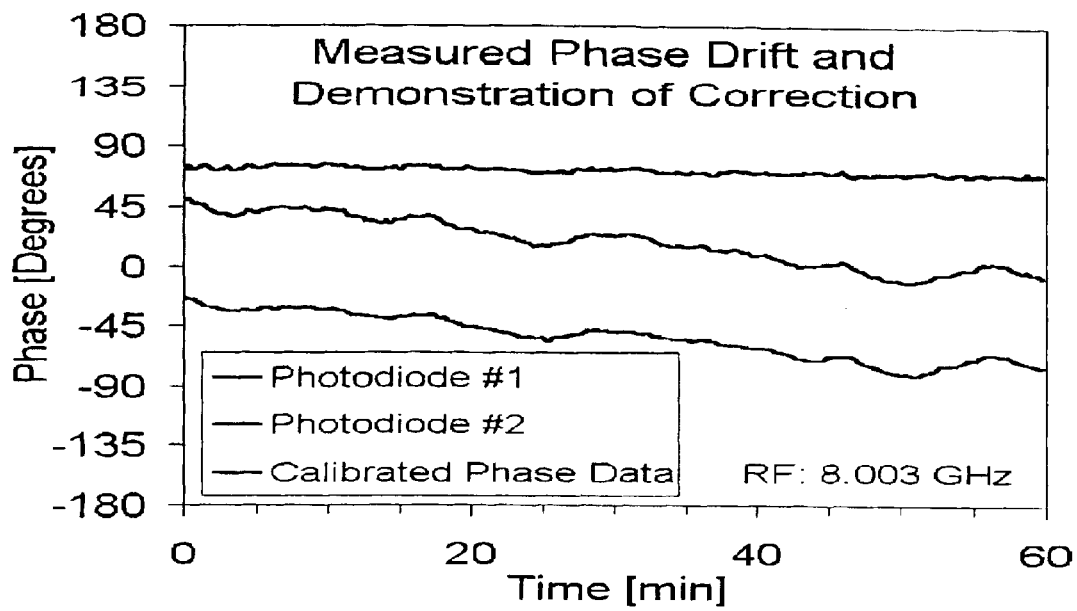
FIG. 15 is a pictorial representation of the full-wave simulation geometry for the examination of invasiveness of the probe on a CPW.

The geometry of the simulation is shown in FIG. 14 Although the transverse orthogonal refractive indexes in the ELECTROOPTIC probe vary in time with the presence of an RF electric field, an index ellipsoid analysis verifies that the change is much less than a fraction of a percent at breakdown fields. Therefore, with negligible error, the electrooptic probe is modeled with a constant dielectric permittivity and a linear electromagnetic simulator is utilized.

Given the electric-field solution in the region of the probe, a quasi-static analysis is performed to determine the charge per unit length, capacitance per unit length, and characteristic impedance versus distance along the direction of propagation. This is valid since the phase in any transverse (xy) plane is essentially constant. The charge per unit length $Q_1$ along the transmission line can be determined as a function of distance as where the integral is $$Ql(z) = \varepsilon \oint_{c(z)} \vec{E} \cdot \vec{dl} \, C/m \quad (8)$$

evaluated in the transverse plane and the contour encloses the center conductor of the transmission line. As long as the contour of integration is selected sufficiently near the conductor, the longitudinal electric-field component will be sufficiently small compared to the transverse components allowing a charge per unit length to be evaluated with a line integral. The capacitance per unit length $C_1$ and characteristic impedance of the transmission line $Z_o$ are obtained from where V (z) is the voltage between conductors, $L_1$, is the inductance per unit $$C_l(z) = \frac{Q_l(z)}{V(z)} F/m$$

$$V(z) = \int_1^2 \vec{E} \cdot d\vec{l} \, v \quad (09)$$

$$Z_o(z) = \sqrt{\frac{L_l}{C_l}} = \sqrt{\frac{1}{C_l, \varepsilon_s = \varepsilon_0(z) \cdot C_l(z)}} \quad (10)$$

length, c is the speed of light in vacuum, and $C_1$, $\epsilon_s=\epsilon_0$ is the capacitance per unit length for a vacuum-filled transmission line.

Figure 16:
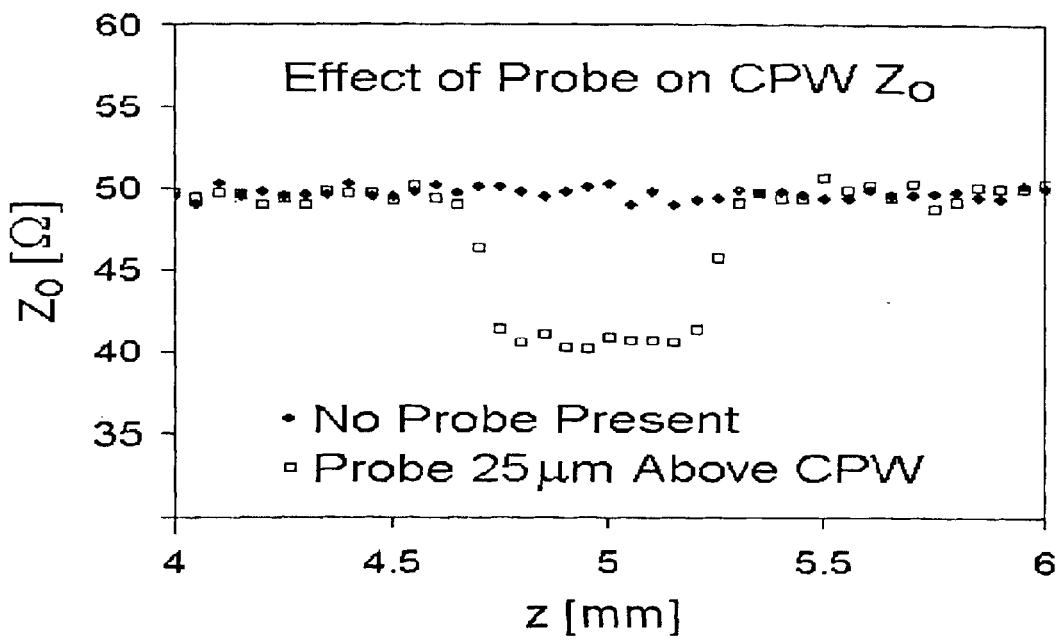
FIG. 16 is a graph depicting results of the spatial extent of the perturbation of the impedance Z of the CPW.
Figure 18:
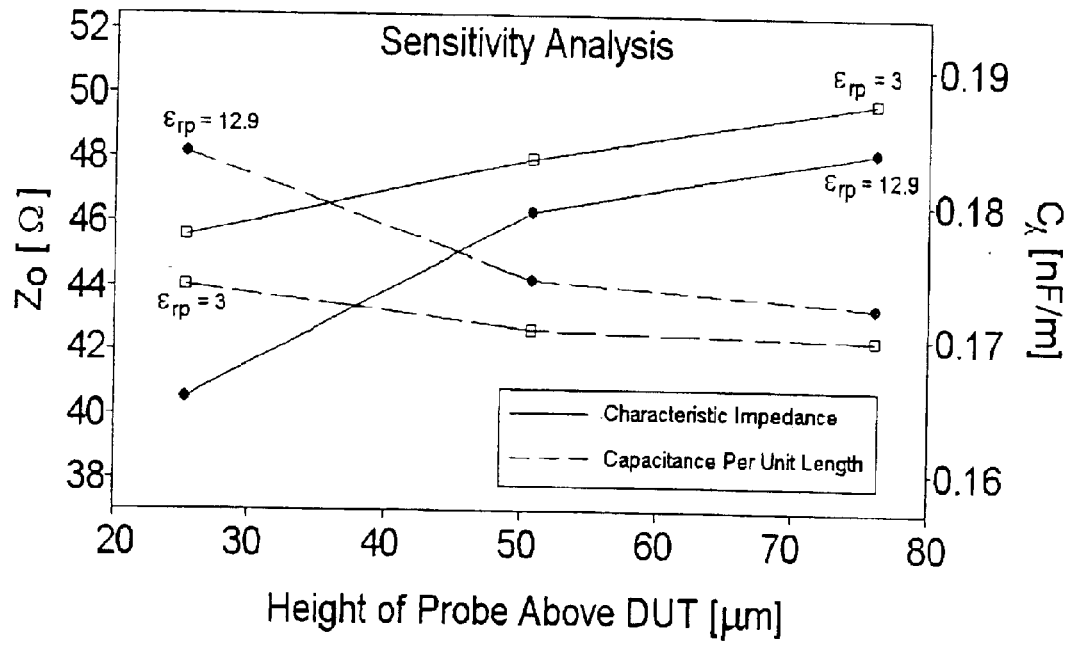
FIG. 18 is a sensitivity analysis of invasiveness simulations of the present invention.

Stimulation results at 10 GHz are shown in FIG. 16 The CPW center conductor width is w=60 $\mu$m and the gap width is s=40 $\mu$m. The substrate is modeled after silicon ($\epsilon_{rl}$=11.7) and the metal is molded with perfect-electric-conducting surfaces. The probe dimensions are 500 $\mu$m×500 $\mu$m×200 $\mu$m and its relative dielectric constant is $\epsilon_{rp}$=12.9 (GaAs). The graded-index lens is patterned after bulk borosilicates glass ($E_{r1}$=2.5) and has a diameter of 1 mm and a length of 2.5 cm. At a height of 25.4 $\mu$m (one full notch on a physical micrometer know), $Z_o$ decreases by 19% and the full-width at half-maximum of the perturbation is 0.5 mm. Hence, the electromagnetic disturbance is essentially localized around the probe. FIG. 18 shows that as the height of the probe decreases the peak characteristic impedance and the peak capacitance per unit length begin to change significantly as the probe comes within 50 $\mu$m of the CPW.

Since the probe fills the top region of the transmission line with a high-dielectric constant material, it capacitively loads down the transmission line, resulting in a local change of the capacitance per unit length. Therefore, the effect of the probe can be modeled with a shunt capacitance across an unloaded line. For RF frequencies such that the guide wavelength is much larger than the width of the probe, the average change in the capacitance per unit length taken over the length of the perturbation provides a value for a lumped-element equivalent-circuit shunt capacitance. The equivalent circuit is shown in the insert of FIG. 18, where the shunt capacitance from the probe is denoted $c_{probe}$. The magnitude of $c_{probe}$ is on the order of a few femtofarads.

B. Measurements of Invasiveness

Figure 17:
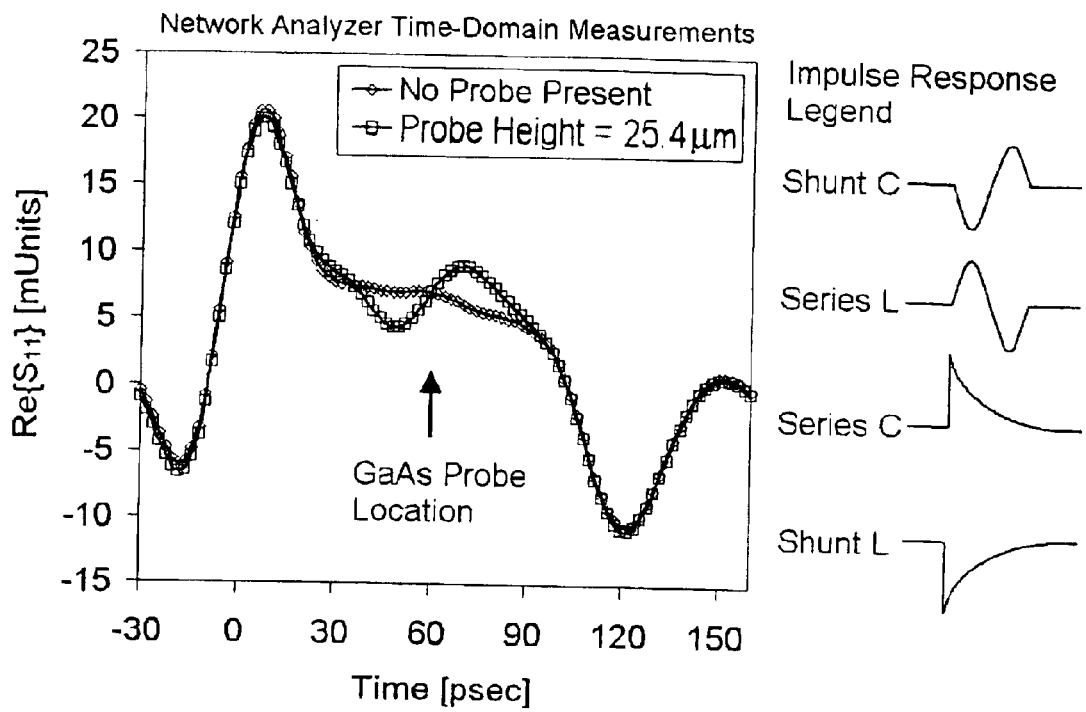
FIG. 17 is a vector-network-analyzer-time-domain graph of the probe over the CPW.

The full-wave simulations were experimentally verified via time-domain (low-pass) measurements using an HP 8510C Network Analyzer and 150-$\mu$m-pitch on-wafer probes. The measured data for a GaAs probe over a CPW transmission line (400-$\mu$m-thick silicon substrate, 1-$\mu$m-thick gold metallization, 60-$\mu$m center conductor, 40-$\mu$m gap) is shown in FIG. 17. The center perturbation is the response from the probe and it clearly appears as a shunt capacitance when the probe is 25.4 $\mu$m above the line. The two side peaks represent the response from the 150-$\mu$m-pitch on -wafer probes.

Figure 19:
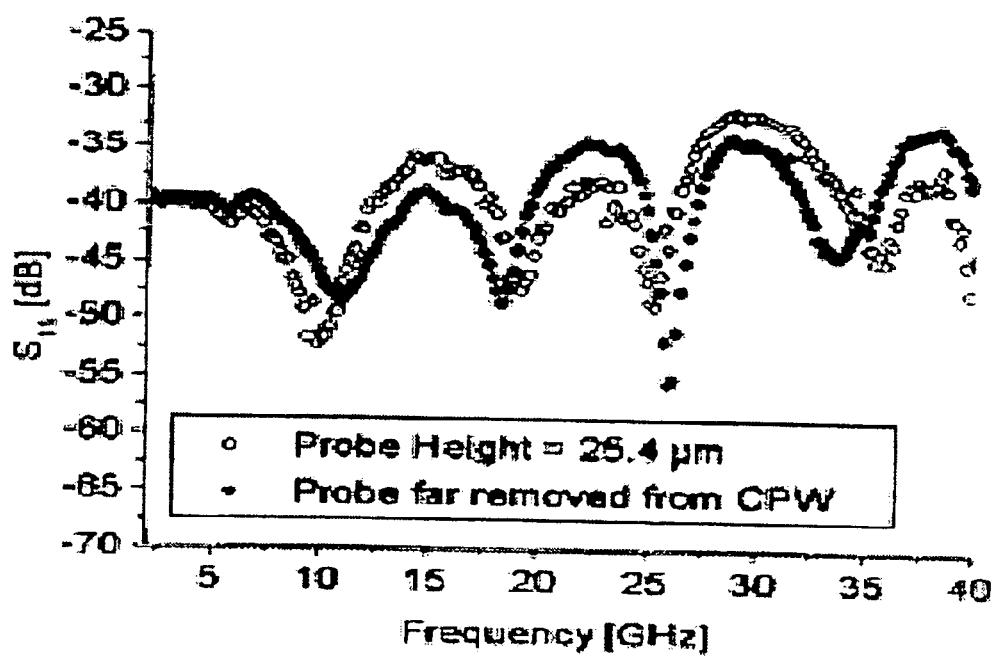
FIG. 19 is a graph of frequency-domain measurements when the probe is over the CPW.
Figure 20:
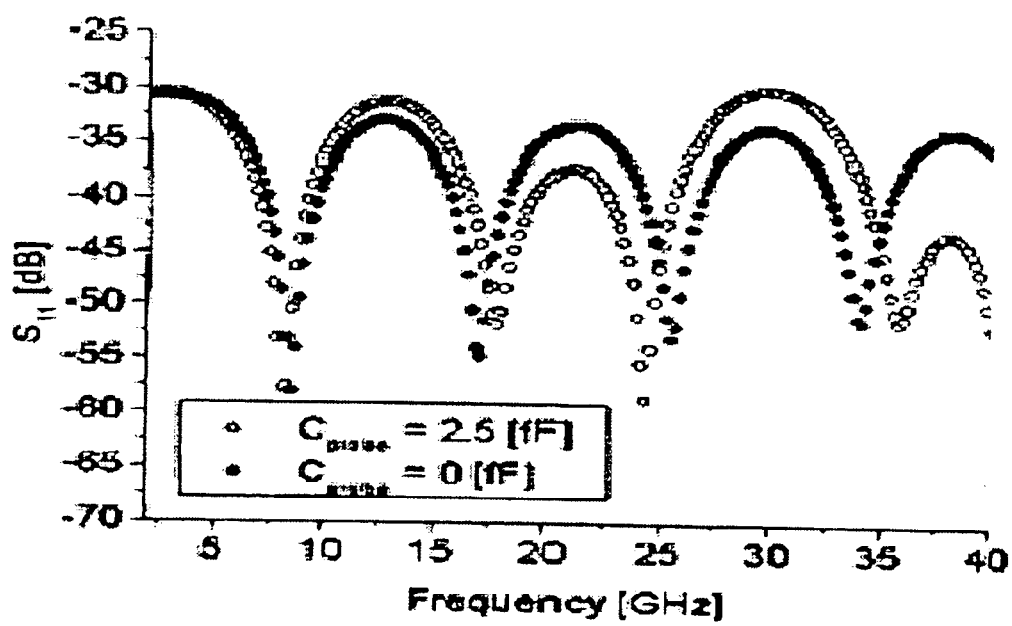
FIG. 20 is simulated data of the CPW with an additional lumped femtofarad shunt capacitor.

The effect of the probe on the return loss in the frequency domain is shown in FIG. 19. The effect of a shunt capacitance is to cause the peaks to alternately shift above and below the response from an unperturbed transmission line. FIG. 20 shows simulated data of a CPW line with an additional lumped femtofarad shunt capacitor.[2] The same behavior of shifted peaks is observed, thereby verifying the order of magnitude of the loading capacitance. The return loss changes by 4 dBm at most where it shifts from −34 to −31 dBm. Therefore, the effect of the probe on $S_{11}$ is essentially negligible.

Applications

To demonstrate the usefulness of the electrothermal probe, the thermal and electric fields of a single MMIC cell within an X-band quasi-optical power-combining array were examined. A horn antenna fed an RF signal to an array of patch antennas, which coupled power to a set of amplifying MMIC's via microstrip line. The output of each MMIC was re-radiated via an array of patch antennas allowing free-space power combining to be accomplished.

Figure 21:
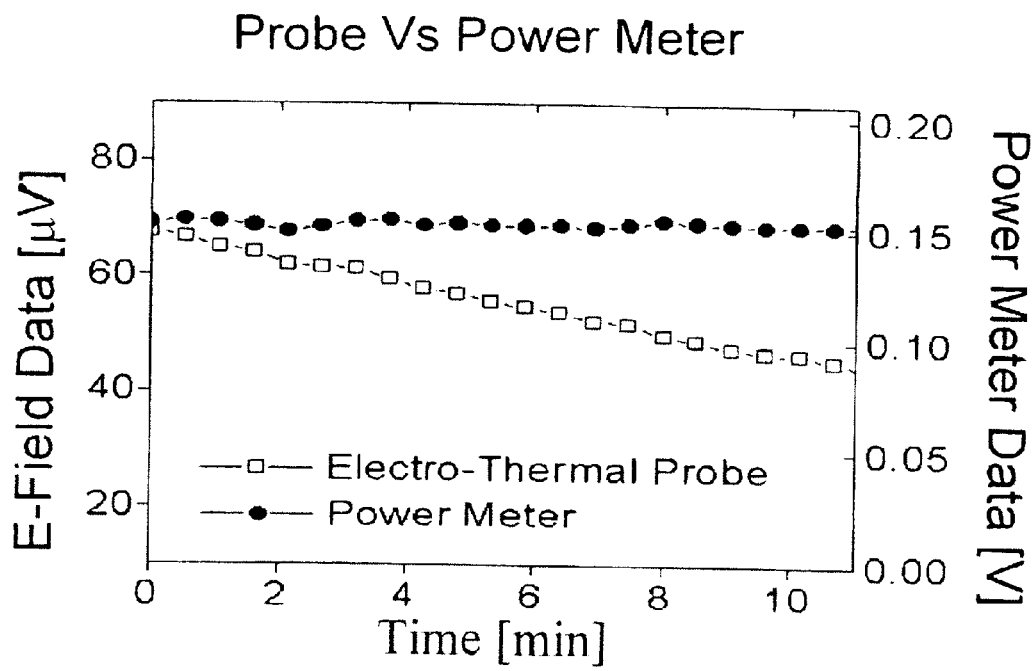
FIG. 21 is a graph depicting probe and power meter measurement of an MMIC.
Figure 22:
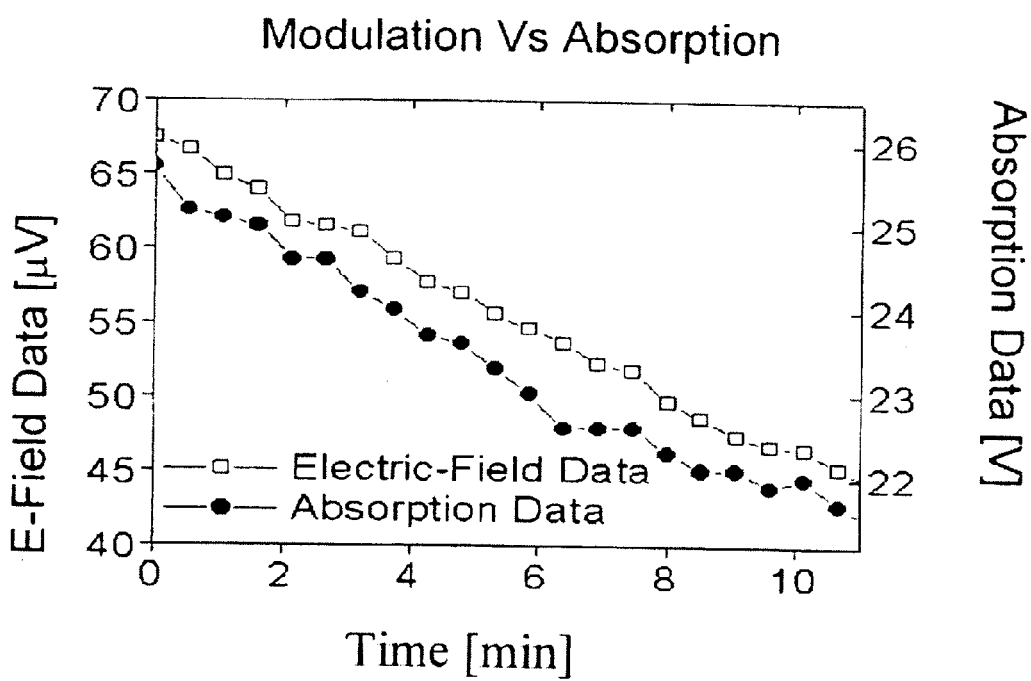
FIG. 22 is a graph depicting probe only measurements of the MMIC.

The probe was mounted near the output of the MMIC and less than 0.5 mm above the microstrip substrate. For comparison purposes, a power meter was mounted in the far field of the array in order to independently monitor its output performance. To isolate the MMIC under test, the input and output patch antennas for all the other MMICs were covered with copper tape. The bias and RF for the array was switched on at time zero. FIG. 21 clearly shows that there is a substantial difference between the behavior of the measured electric-field data obtained from the probe and the measured power from the independent power meter. The explanation for the discrepancy is shown in FIG. 22 as the absorption data from the probe is seen to decrease with time along with the electric-field data. The change in the absorption signal is consistent with the expected increase in temperature in the vicinity of the biased MMIC due to the dissipation of heat.

Figure 23:
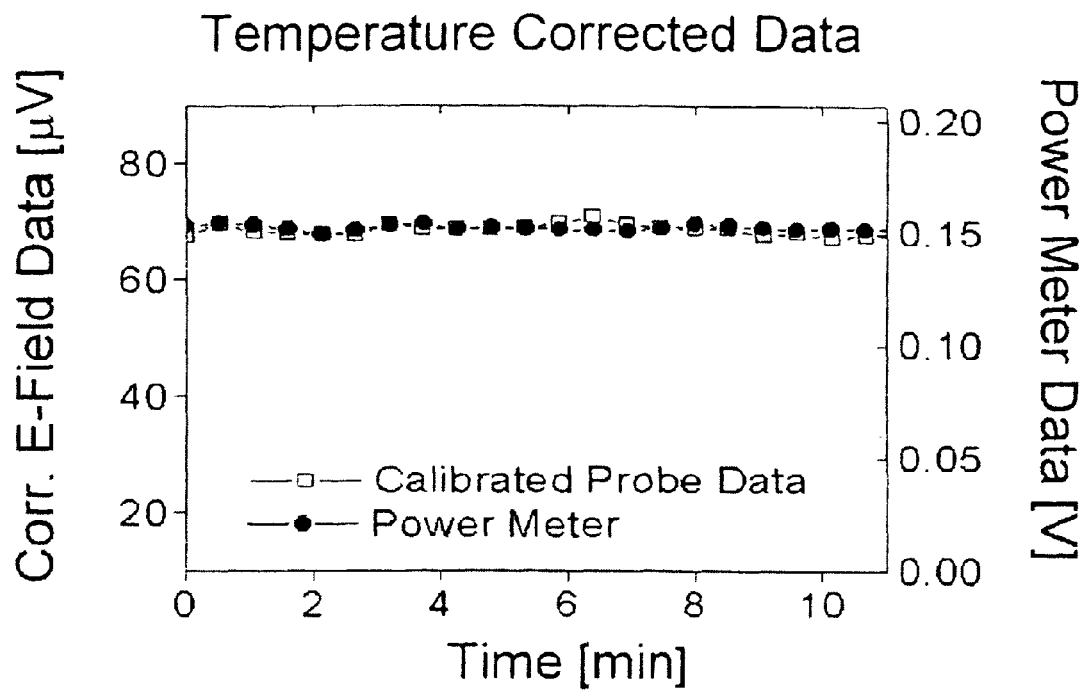
FIG. 23 is a graph depicting temperature-calibrated electric field data.

Calibration of the temperature effects of the probe on the electric-field measurements is possible since the absorption signal is linearly proportional to the electric-field signal. Knowledge of the deviation of the absorption signal with time $\Delta V_{80\ MHz}$ allows for the compensation of the modulation signal for temperature effects according to $$V^1_{3\ MHz} = \left(\frac{dV_{3\ MHz}}{dV_{80\ MHz}}\right)\Delta V_{80\ MHz} + V_{3\ MHz} \quad (11)$$

where the primed notatin denotes temperature-calibrated data. The results of this calibration method are shown in FIG. 23. The calibrated electric-field data is now in excellent agreement with the independent power-meter measurements. The calculated standard deviation is 1.3%.

Figure 24:
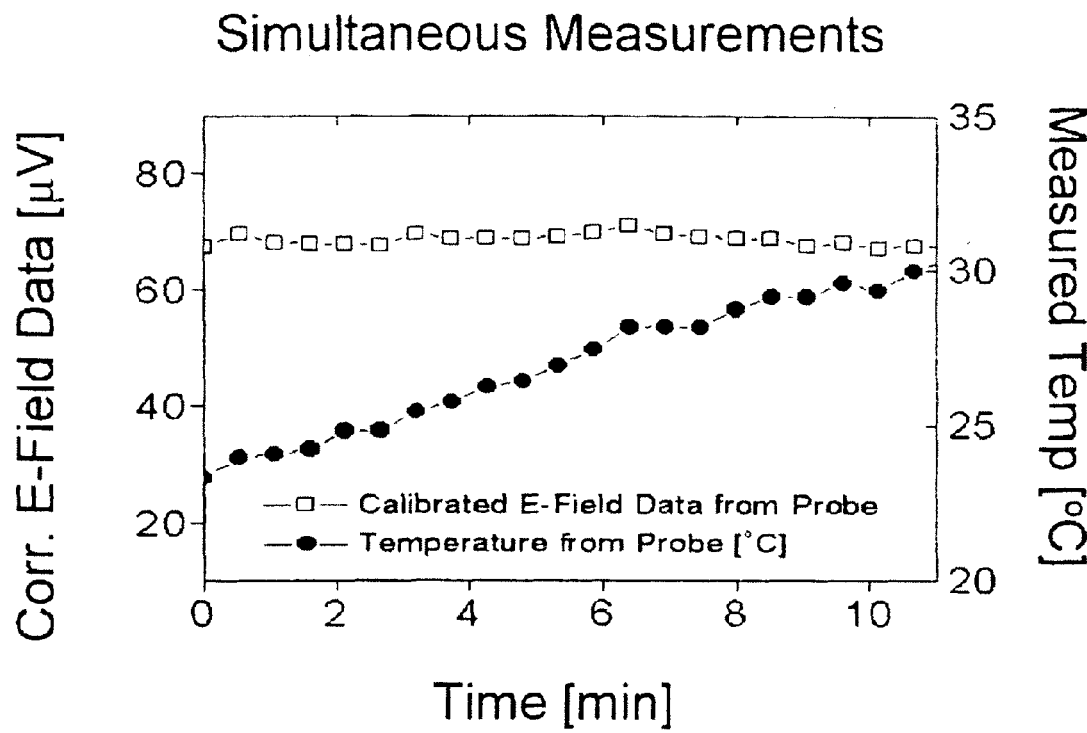
FIG. 24 is a graph depicting simultaneous electric-field and temperature measurements of the MMIC by the probe of the present invention.

FIG. 24 illustrates the results from the simultaneous data collected from the probe. Knowledge of the initial room temperature, the optical-power/temperature relationship, and the deviation of the 80-MHZ component with time allow for the scaling of the 80-MHZ component to degrees Celsius. The region neighboring the output of the MMIC is seen to increase by 7° C. in 11 min.

Thus, there has been disclosed an integrated electro-thermal probe and measurement apparatus capable of simultaneously measuring thermal and electric fields. This probe and novel measurement technique allow for the calibration of electric field data that is corrupted when the probe is used in regions where temperature gradients exist. The probe has capability which provides means to analyze coupled electro-thermal phenomena in complex active microwave and millimeter wave structures, such as quasi-optical amplifiers.

What is claimed is:

1. An electro-thermal field mapping apparatus for scanning a workpiece comprising:
   means for generating an optical signal;
   an electro-optic field-mapping sensor for receiving the generated optical signal and for generating an output optical signal influenced by a free-space electric field associated with the workpiece passing through an operable range of the sensor;
   means for sensing a characteristic of the output optical signal containing electric field information; and
   bandgap modulation means for compensating the sensed characteristic of the output optical signal containing electric field information for corruption due to temperature variations.

2. The apparatus of claim 1 wherein the sensor further comprises:
   at least one crystal having a predetermined orientation.

3. The apparatus of claim 2 further comprising:
   the crystal made of gallium arsenide (GaAs).

4. The apparatus of claim 1 further comprising:
   means for scaling relative electric field information to absolute units.

5. The apparatus of claim 1 further comprising:
   means for stabilizing electric field phase drift.

6. The apparatus of claim 1 further comprising:
   means for filtering an optical signal so that electric field information and temperature information are distinguishable.

7. The apparatus of claim 1 further comprising:
   means for measuring temperature from the output optical signal.

8. The apparatus of claim 1 further comprising:
   means for simultaneously measuring electric field and temperature from the output optical signal.

9. The apparatus of claim 1, wherein the sensing means senses a characteristic of the output optical signal corresponding to a characteristic containing temperature related information.

10. A method for scanning a workpiece with an electro-thermal apparatus comprising the steps of:
    generating an optical signal;
    receiving the generated optical signal and generating an output optical signal with an electro-optic field-mapping sensor influenced by a free-space electric field associated with a workpiece passing through an operable range of the sensor changing a characteristic of the optical signal;
    sensing a characteristic of the output optical signal; and
    compensating the sensed characteristic of the output optical signal for corruption due to temperature variations with bandgap modulation of at least a portion of the output optical signal.

11. The method of claim 10 further comprising the step of:
    providing the sensor with at least one crystal having a predetermined orientation.

12. The method of claim 11 further comprising the step of:
    providing the crystal made of gallium arsenide (GaAs).

13. The method of claim 10 further comprising the step of:
    scaling relative electric field information to absolute units.

14. The method of claim 10 further comprising the step of:
    stabilizing electric field phase drift.

15. The method of claim 10 further comprising the step of:
    filtering an electrical signal proportional to the output optical signal so that electric field information and temperature information are distinguishable.

16. The method of claim 10 further comprising the step of:
    measuring temperature from the output optical signal.

17. The method of claim 10 further comprising the step of:
    simultaneously measuring electric field and temperature.

18. The method of claim 10, wherein the sensing step further comprises the step of:
    sensing a characteristic of the output optical signal that contains temperature related information.

19. An electro-thermal field mapping apparatus for scanning a workpiece comprising:
    means for generating an optical signal;
    an electro-optic field-mapping sensor for receiving the generated optical signal and for generating an output optical signal influenced by an electric field associated with the workpiece passing through an operable range of the sensor;
    means for sensing a characteristic of the output optical signal containing electric field magnitude and phase information; and
    means for deriving the sensed characteristic independent of temperature variations.

20. The apparatus of claim 19, wherein the deriving means further comprises compensating a portion of the output optical signal containing information about the electric field with another portion of the output optical signal containing information about temperature.

21. The apparatus of claim 19, wherein the deriving means further comprises compensating for temperature variations with a value corresponding to a function of an attenuation of a portion of the output optical signal independent of another portion of the output optical signal containing information on the electric field to correct a size value of a portion of the output optical signal including information on the electric field.

22. The apparatus of claim 19, wherein the electro-optic field-mapping sensor comprises a temperature-dependent semiconductor probe, and the deriving means comprises compensating for temperature variations with bandgap modulation of the output optical signal from the temperature-dependent semiconductor probe.

23. The apparatus of claim 22, wherein the electro-optic field-mapping sensor and the temperature-dependent semiconductor probe comprise a gallium arsenide (GaAs) crystal for simultaneously measuring electric field and temperature characteristics.

24. The apparatus of claim 19, wherein the output optical signal carries information about both the electric field and temperature at a first modulation frequency component, and carries information about temperature only at a second modulation frequency component, such that the temperature information carried by the second modulation frequency component can be used to compensate for temperature effects on the electric field information carried by the first modulation frequency component.

25. The apparatus of claim 24, wherein frequencies below a filter cutoff frequency of a low-pass filter contain information on the electric field to be measured.

26. The apparatus of claim 24, wherein frequencies above a filter cutoff frequency of a low-pass filter contain information on both the electric field to be measured and the temperature.

27. The apparatus of claim 24, wherein the frequencies above a filter cutoff frequency of a high-pass filter contain information about temperature of the electro-optical, field-mapping sensor only.

28. The apparatus of claim 19, wherein the electro-optical field-mapping sensor measures at least one of guided radio frequency signals, free-space radio frequency signals, guided microwave signals, and free-space microwave signals.

29. The apparatus of claim 19, wherein the deriving means includes an opto-electronic function with bandgap modulation in the electro-optical field-mapping sensor used to sense the electrical field magnitude and phase.

30. The apparatus of claim 19, wherein the deriving means compensates for temperature variation effects on a first portion of the output optical signal including a combination of electric field and temperature information using a measured quantity corresponding to absorption of one other specific portion of the output optical signal including only temperature information.

* * * * *